United States Patent
Moon et al.

(10) Patent No.: US 9,646,704 B2
(45) Date of Patent: May 9, 2017

(54) OPERATING METHOD FOR NONVOLATILE MEMORY AND OPERATING METHOD FOR STORAGE DEVICE INCLUDING THE NONVOLATILE MEMORY

(71) Applicants: Sangkwon Moon, Osan-si (KR); Sung-Hwan Bae, Seoul (KR); Seungkyung Ro, Anyang-si (KR)

(72) Inventors: Sangkwon Moon, Osan-si (KR); Sung-Hwan Bae, Seoul (KR); Seungkyung Ro, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/800,038

(22) Filed: Jul. 15, 2015

(65) Prior Publication Data

US 2016/0133329 A1    May 12, 2016

(30) Foreign Application Priority Data

Nov. 7, 2014   (KR) .................. 10-2014-0154323

(51) Int. Cl.

| | | |
|---|---|---|
| *G11C 16/04* | (2006.01) | |
| *G11C 16/14* | (2006.01) | |
| *G11C 16/10* | (2006.01) | |
| *G11C 16/20* | (2006.01) | |
| *G11C 16/34* | (2006.01) | |
| *H01L 27/115* | (2017.01) | |

(52) U.S. Cl.
CPC ............. *G11C 16/14* (2013.01); *G11C 16/10* (2013.01); *G11C 16/20* (2013.01); *G11C 16/0483* (2013.01); *G11C 16/3459* (2013.01); *H01L 27/115* (2013.01)

(58) Field of Classification Search
CPC .... G11C 16/0483; G11C 16/10; H01L 27/115
USPC .... 365/185.17, 230.03, 226, 185.22, 185.24, 365/185.2, 185.03
See application file for complete search history.

(56) References Cited

U.S. PATENT DOCUMENTS

| | | |
|---|---|---|
| 6,421,272 B1 | 7/2002 | Noguchi |
| 7,072,214 B2 | 7/2006 | Jeong et al. |
| 7,307,884 B2 | 12/2007 | Guterman |
| 7,317,654 B2 | 1/2008 | Kim et al. |
| 7,660,160 B2 | 2/2010 | Kim et al. |
| 7,679,133 B2 | 3/2010 | Son et al. |
| 8,000,145 B2 | 8/2011 | Lim |
| 8,144,511 B2 | 3/2012 | Dong et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,811,091 B2 | 8/2014 | Li et al. |
| 2011/0233648 A1 | 9/2011 | Seol et al. |

(Continued)

FOREIGN PATENT DOCUMENTS

JP       H10-134588 A     5/1998

*Primary Examiner* — Jason Lappas
(74) *Attorney, Agent, or Firm* — Volentine & Whitt, PLLC

(57) ABSTRACT

An operation method of a storage device including a nonvolatile memory and a memory controller controlling the nonvolatile memory, includes transmitting a multi-program command to the nonvolatile memory by the memory controller; and programming memory cells connected to two or more word lines by the nonvolatile memory in response to the multi-program command.

20 Claims, 20 Drawing Sheets

(56) References Cited

U.S. PATENT DOCUMENTS

2011/0292725 A1* 12/2011 Choi .................. G11C 11/5628
                                                    365/185.03
2014/0047163 A1   2/2014 Kwak
2014/0153333 A1   6/2014 Avila et al.

* cited by examiner

OPERATING METHOD FOR NONVOLATILE MEMORY AND OPERATING METHOD FOR STORAGE DEVICE INCLUDING THE NONVOLATILE MEMORY

CROSS-REFERENCE TO RELATED APPLICATIONS

A claim for priority under 35 U.S.C. §119 is made to Korean Patent Application No. 10-2014-0154323, filed on Nov. 7, 2014 in the Korean Intellectual Property Office, the entire contents of which are hereby incorporated by reference.

BACKGROUND

The inventive concept described herein relates to a semiconductor memory, and more particularly, to an operating method for a nonvolatile memory and an operating method for a storage device including the nonvolatile memory.

Storage devices typically store data according to control of a host device such as a computer, a smart phone, a smart pad, or the like. Such storage devices may store data in magnetic disks such as a hard disk drives (HDDs), solid state drives (SSDs), semiconductor memories such as memory cards, and in particular in nonvolatile memory.

Nonvolatile memory includes read only memory (ROM), programmable ROM (PROM), electrically programmable ROM (EPROM), electrically erasable and programmable ROM (EEPROM), flash memory, phase-change RAM (PRAM), resistive RAM (RRAM), ferroelectric RAM (FRAM), or the like.

As semiconductor manufacturing technology advances, the demand for highly integrated storage devices with large capacity continuously increases. Highly integrated storage devices may advantageously be manufactured with reduced production cost. However, as the scale of storage devices is reduced due to the demand for high integration, various unforeseen problems may be encountered. For example, data stored in highly integrated storage devices may be more easily corrupted, resulting in reduced reliability.

SUMMARY

Embodiments of the inventive concept provide an operation method of a storage device including a nonvolatile memory and a memory controller configured to control the nonvolatile memory. The operation method includes transmitting a multi-program command to the nonvolatile memory from the memory controller; and programming memory cells connected to two or more word lines in the nonvolatile memory responsive to the multi-program command.

Embodiments of the inventive concept also provide an operation method of a nonvolatile memory. The operation method includes receiving a multi-program command at the nonvolatile memory; and programming memory cells connected to two or more word lines in the nonvolatile memory using dummy data responsive to the multi-program command.

Embodiments of the inventive concept also provide a storage device that includes a nonvolatile memory including a plurality of memory blocks, and a memory controller. The memory controller is configured to select a memory block to be closed from among the memory blocks of the nonvolatile memory, the selected memory block including memory cells that are connected to two or more word lines and that are in an erase state. The memory controller is further configured to transmit a multi-program command to the selected memory block. The nonvolatile memory is configured to program memory cells of the selected memory block connected to the two or more word lines using dummy data, responsive to the multi-program command.

BRIEF DESCRIPTION OF THE DRAWINGS

Embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF EMBODIMENTS

Figure 1:
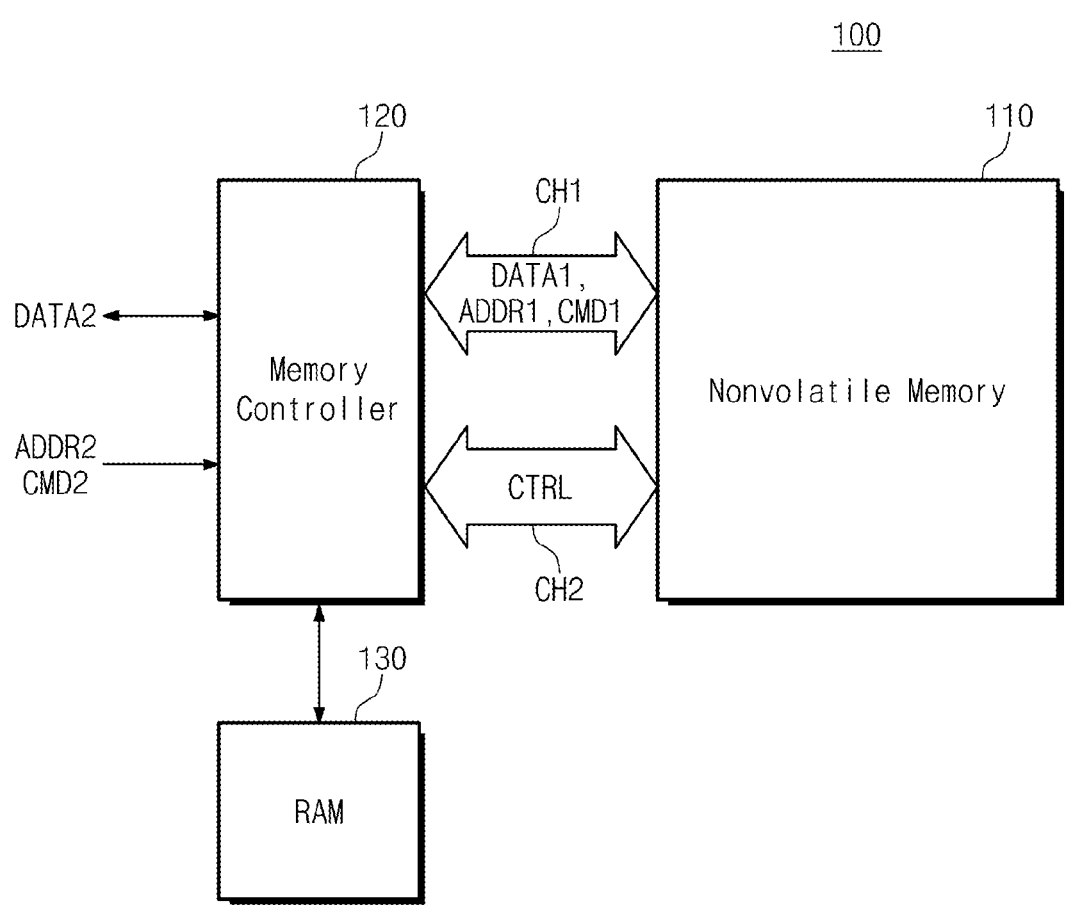
FIG. 1 is a block diagram illustrating a storage device in accordance with some embodiments of the inventive concept.

Embodiments of inventive concept will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers may refer to like elements throughout.

FIG. 1 is a block diagram illustrating a storage device 100 in accordance with some embodiments of the inventive concept. Referring to FIG. 1, the storage device 100 includes a nonvolatile memory 110, a memory controller 120 and a RAM 130.

The nonvolatile memory 110 performs write, read and erase operations according to control of the memory controller 120. The nonvolatile memory 110 exchanges first data DATA1 with the memory controller 120. For example, the nonvolatile memory 110 receives the first data DATA1 from the memory controller 120 and writes the first data DATA1 therein. The nonvolatile memory 110 performs a read operation and outputs the read first data DATA1 to the memory controller 120.

The nonvolatile memory 110 receives a first command CMD1 and a first address ADDR1 from the memory controller 120. The nonvolatile memory 110 exchanges a control signal CTRL with the memory controller 120. For example, the memory controller 120 may output a control signal CTRL including at least one of a chip select signal /CE that selects at least one semiconductor chip among a plurality of semiconductor chips constituting the nonvolatile memory 110, a command latch enable signal CLE the indicates that a signal being received from the memory controller 120 is a first command CMD1, an address latch enable signal ALE that indicates that a signal being received from the memory controller 120 is a first address ADDR1, a read enable signal /RE that is generated by the memory controller 120 during a read operation and is periodically toggled to be used to adjust the timing, a write enable signal /WE that is activated by the memory controller 120 when the first command CMD1 or the first address ADDR1 is transmitted, a write protection signal /WP that is activated by the memory controller 120 to prevent an unwanted write or erase when a power supply is changed, and a data strobe signal DQS that is generated by the memory controller 120 during a write operation and is periodically toggled to be used to adjust an input sync of the first data DATA1. For example, the nonvolatile memory 110 may output a control signal CTRL including at least one of a ready & busy signal R/nB that indicates whether the nonvolatile memory 110 is performing a program, erase or read operation, and a data strobe signal DQS that is generated from the read enable signal /RE by the nonvolatile memory 110 and is periodically toggled to be used to adjust an output sync of the first data DATA1 output to the memory controller 120.

The first data DATA1, the first address ADDR1 and the first command CMD1 communicate with the memory controller 120 through a first channel CH1. The first channel CH1 may be an input/output channel. The control signal CTRL communicates with the memory controller 120 through a second channel CH2. The second channel CH2 may be a control channel.

The nonvolatile memory 110 may include a flash memory. However, the nonvolatile memory 110 is not limited to include a flash memory. In some embodiments of the inventive concept the nonvolatile memory 110 may include at least one of various types of nonvolatile memories such as a phase-change RAM (PRAM), a magnetic RAM (MRAM), an resistive RAM (RRAM), a ferroelectric RAM (FeRAM), or the like.

The memory controller 120 is configured to control the nonvolatile memory 110. For example, the memory controller 120 may control the nonvolatile memory 110 to perform a write operation, a read operation or an erase operation. The memory controller 120 may exchange the first data DATA1 and the control signal CTRL with the nonvolatile memory 110 and may output the first command CMD1 and the first address ADDR1 to the nonvolatile memory 110.

The memory controller 120 may control the nonvolatile memory 110 under the control of a host device (not shown). The memory controller 120 may exchange second data DATA2 with the host device and may receive a second command CMD2 and a second address ADDR2 from the host device.

The memory controller 120 may exchange the first data DATA1 with the nonvolatile memory 110 by a first unit (for example, a time unit or a data unit) and may exchange the second data DATA2 with the host device by a second unit different from the first unit.

The memory controller 120 may exchange the first data DATA1 with the nonvolatile memory 110 according to a first format and may transmit the first command CMD1 and the first address ADDR1 to the nonvolatile memory 110. The memory controller 120 may exchange the second data DATA2 with the host device according to a second format different from the first format and may receive the second command CMD2 and the second address ADDR2 from the host device.

The memory controller 120 may use the RAM 130 as a buffer memory, a cache memory or an operation memory. For example, the memory controller 120 may receive the second data DATA2 from the host device, store the received second data DATA2 in the RAM 130 and write the second data DATA2 stored in the RAM 130 in the nonvolatile memory 110 as the first data DATA1. The memory controller 120 may read the first data DATA1 from the nonvolatile memory 110, store the read first data DATA1 in the RAM 130 and output the first data DATA1 stored in the RAM 130 to the host device as the second data DATA2. The memory controller 120 may store data read from the nonvolatile memory 110 in the RAM 130, and write the data stored in the RAM 130 in the nonvolatile memory 110 again.

The memory controller 120 may store data or code needed to manage the nonvolatile memory 110 in the RAM 130. For example, the memory controller 120 may read data or code needed to manage the nonvolatile memory 110 from the nonvolatile memory 110 and may load the data or the code into the RAM 130 to drive the data or the code.

The RAM 130 may include at least one of various random access memories such as a dynamic RAM (DRAM), a static RAM (SRAM), a synchronous DRAM (SDRAM), a phase-change RAM (PRAM), a magnetic RAM (MRAM), a resistive RAM (RRAM), a ferroelectric RAM (FRAM), or the like.

The storage device 100 may perform an address mapping to reduce overhead resulting from an error operation in the storage device 100. For example, when an overwrite operation is requested by the external host device, the storage device 100 may store overwrite requested data in memory cells of a free storage space, instead of erasing memory cells storing existing data to store the overwrite requested data in the erased memory cells. The memory controller 120 may drive an FTL (flash translation layer) that maps a logical address used in the external host device and a physical address used in the nonvolatile memory 110 according to the above-described method. For example, the second address ADDR2 may be a logical address and the first address ADDR1 may be a physical address.

The storage device 100 may perform a write operation, a read operation or an erase operation of data according to a request of the host device. The storage device 100 may include a solid state drive (SSD) or a hard disk drive (HDD). The storage device 100 may include memory cards such as a personal computer memory card international association (PCMCIA) card, a compact flash (CF) card, a smart media card (SM, SMC), a memory stick, a multimedia card (MMC, RS-MMC, MMCmicro), an SD card (SD, miniSD, microSD, SDHC), a universal flash memory device (UFS), or the like. The storage device 100 may include a mounted type memory such as an eMMC (embedded multimedia card), a universal flash storage (UFS), a perfect page new (PPN), or the like.

The memory controller 120 may transmit a program command, a read command, an erase command or a multi-program command to the nonvolatile memory 110 as the first command CMD1. The memory controller 120 may request programming of a unit of a word line (wordline) of the nonvolatile memory 110 through the program command. The memory controller 120 may request reading of a unit of a word line of the nonvolatile memory 110 through the read command. The memory controller 120 may request erasing of a unit of a memory block or a sub block of the nonvolatile memory 110 through the erase command. The memory controller 120 may request programming with respect to a plurality of word lines of the nonvolatile memory 120 through a multi-program command. The multi-program command and the multi-program operation related to the multi-program command will be described in further detail with reference to the accompanying drawings.

Figure 2:
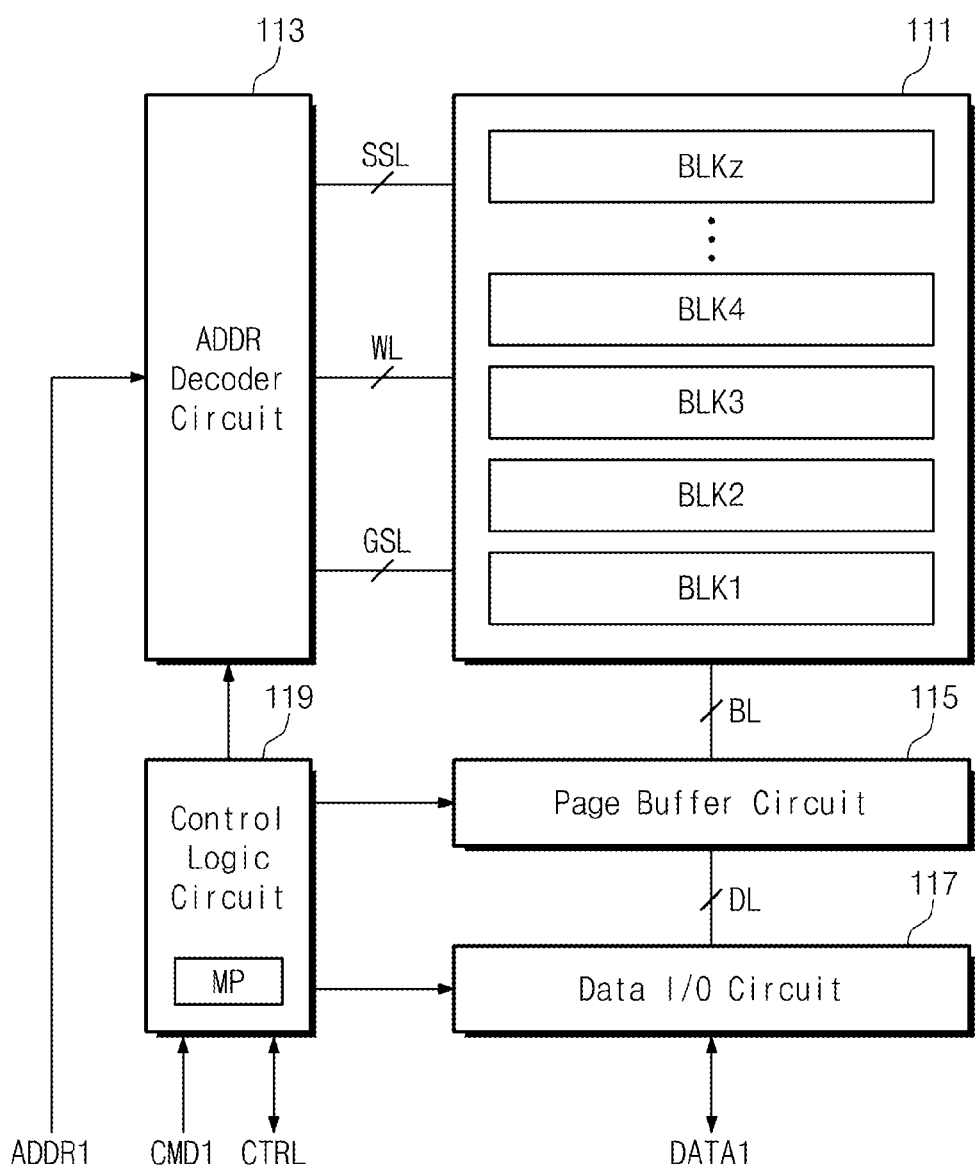
FIG. 2 is a block diagram illustrating a nonvolatile memory in accordance with some embodiments of the inventive concept.

FIG. 2 is a block diagram illustrating a nonvolatile memory 110 in accordance with some embodiments of the inventive concept. Referring to FIGS. 1 and 2, the nonvolatile memory 110 includes a memory cell array 111, an address decoder circuit 113, a page buffer circuit 115, a data input/output circuit 117 and a control logic circuit 119.

The memory cell array 111 includes a plurality of memory blocks BLK1~BLKz. Each memory block includes a plurality of memory cells. Each memory block may be connected to the address decoder circuit 113 through at least one string select line SSL, a plurality of word lines WL and at least one ground select line GSL. Each memory block may be connected to the page buffer circuit 115 through a plurality of bit lines BL. The memory blocks BLK1~BLKz may be connected to a plurality of bit lines BL in common. Memory cells of the memory blocks BLK1~BLKz may have the same structure. Each of the memory blocks BLK1~BLKz may be an erase operation unit. Memory cells of the memory cell array 111 may be erased by a memory block unit. Memory cells included in one memory block may be erased at the same time. Each memory block may be divided into a plurality of sub blocks. In some embodiments of the inventive concept, each sub block may be an erase operation unit.

The address decoder circuit 113 is connected to the memory cell array 111 through a plurality of ground select lines GSL, a plurality of word lines WL and a plurality of string select lines SSL. The address decoder circuit 113 operates according to a control of the control logic circuit 119. The address decoder circuit 113 receives a first address ADDR1 from the memory controller 120. The address decoder circuit 113 decodes the received first address ADDR1 and controls voltages applied to the word lines WL according to the decoded address.

For example, during a program operation, the address decoder circuit 113 applies a program voltage VPGM to a selected word line of a selected memory block indicated by the first address ADDR1 and applies a pass voltage VPASS to unselected word lines of the selected memory block. During a read operation, the address decoder circuit 113 applies a select read voltage VRD to the selected word line of the selected memory block indicated by the first address ADDR1 and applies an unselect read voltage VREAD to the unselected word lines of the selected memory block. During an erase operation, the address decoder circuit 113 applies an erase voltage (for example, a ground voltage) to word lines of the selected memory block indicated by the first address ADDR1.

The page buffer circuit 115 is connected to the memory cell array 111 through the bit lines BL. The page buffer circuit 115 is connected to the data input/output circuit 117 through a plurality of data lines DL. The page buffer circuit 115 operates under the control of the control logic circuit 119.

The page buffer circuit 115 may store data to be programmed in memory cells of the memory cell array 111, or data read from the memory cells. During a program operation, the page buffer circuit 115 stores data to be programmed in the memory cells. The page buffer circuit 115 may bias the bit lines BL on the basis of the stored data. During the program operation, the page buffer circuit 115 functions as a write driver. During a read operation, the page buffer circuit 115 senses voltages of the bit lines BL and stores a sensing result. During the read operation, the page buffer circuit 115 functions as a sense amplifier.

The data input/output circuit 117 is connected to the page buffer circuit 115 through the data lines DL. The data input/output circuit 117 exchanges the first data DATA1 with the memory controller 120.

The data input/output circuit 117 may temporarily store data received from the memory controller 120. The data input/output circuit 117 transmits the stored data to the page buffer circuit 115. The data input/output circuit 117 also temporarily stores data transmitted from the page buffer circuit 115, and transmits the temporarily stored data to the memory controller 120. The data input/output circuit 117 functions as a buffer memory.

The control logic circuit 119 receives the first command CMD1 and the control signal CTRL from the memory controller 120. The control logic circuit 119 decodes the received first command CMD1 and controls an overall operation of the nonvolatile memory 110 according to the decoded command.

During the read operation, the control logic circuit 119 generates a data strobe signal DQS from a read enable signal /RE from among the received control signal CTRL and outputs the data strobe signal DQS. During a write operation, the control logic circuit 119 generates a data strobe signal DQS from a write enable signal /WE from among the received control signal CTRL and outputs the data strobe signal DQS.

The control logic circuit 119 includes a multi-program controller MP. Responsive to receipt of a multi-program command as the first command CMD1, the multi-program controller MP controls the address decoder 113 and the page buffer circuit 115 to perform a multi-program operation. For example, the multi-program controller MP controls the page buffer circuit 115 so that the bit lines BL are biased. For example, the multi-program controller MP loads dummy data into the page buffer circuit 115 so that the bit lines BL are biased (e.g., to a ground voltage). The multi-program controller MP controls the address decoder circuit 113 so that program voltages are applied to two or more word lines corresponding to addresses ADDR related with the multi-program command at the same time.

Figure 3:
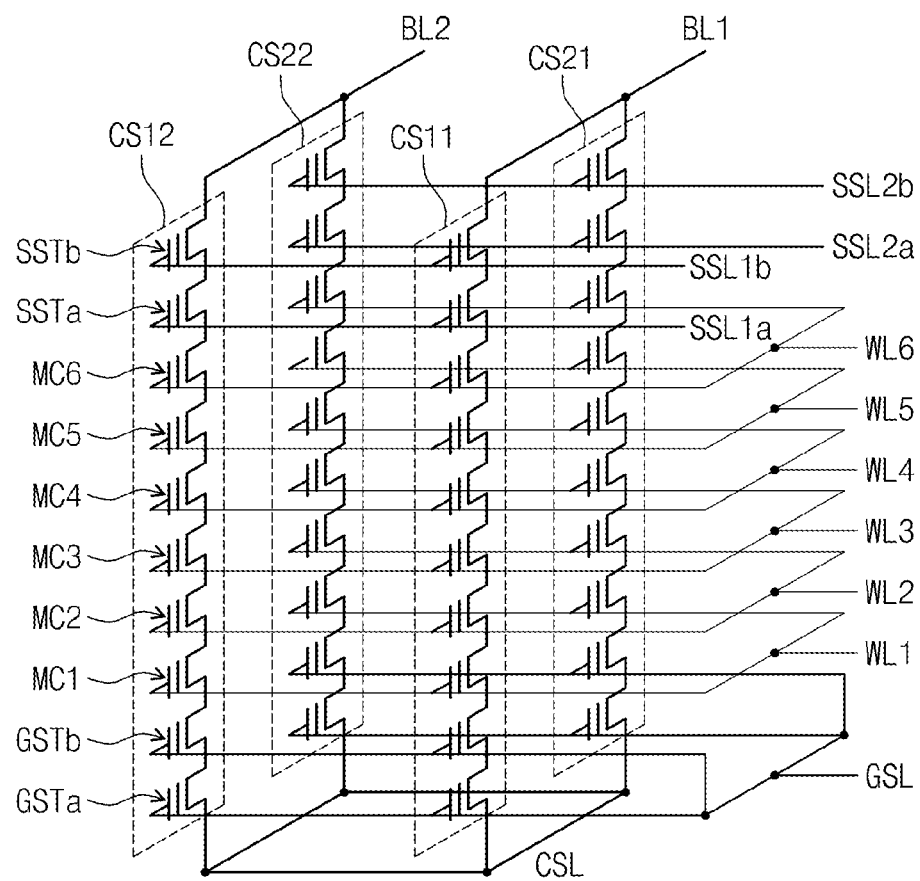
FIG. 3 is a circuit illustrating a memory block in accordance with some embodiments of the inventive concept.
Figure 3:
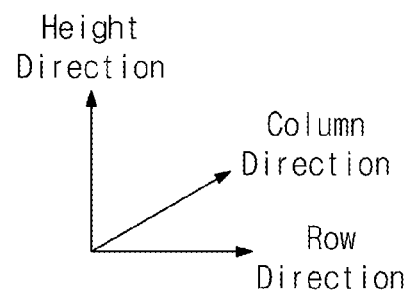

FIG. 3 is a circuit illustrating a memory block BLKa in accordance with some embodiments of the inventive concept. Referring to FIG. 3, the memory block BLKa includes a plurality of cell strings CS11~CS21 and CS12~CS22. The cell strings CS11~CS21 and CS12~CS22 are arranged along a row direction and a column direction to form rows and columns of cell strings.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string includes a plurality of cell transistors. The cell transistors include ground select transistors GSTa and GSTb, memory cells MC1~MC6 and string select transistors SSTa and SSTb. The ground select transistors GSTa and GSTb, the memory cells MC1~MC6 and the string select transistors SSTa and SSTb of each cell string are stacked in a direction perpendicular to a plane (for example, a plane on a substrate of the memory block BLKa) on which the cell strings CS11~CS21 and CS12~CS22 are arranged along the row direction and the column direction.

The cell transistors may be charge trap transistors having threshold voltages that vary according to a quantity of charges trapped in an insulating layer.

The lowermost ground select transistors GSTa are connected to a common source line CSL in common.

The ground select transistors GSTa and GSTb of the cell strings CS11~CS21 and CS12~CS22 are connected to the ground select line GSL in common.

In some embodiments of the inventive concept, ground select transistors of the same height (or order) may be connected to the same ground select line, and ground select transistors of different heights may be connected to different ground select lines. For example, the ground select transistors GSTa of a first height may be connected to a first ground select line in common, and the ground select transistors GSTb of a second height may be connected to a second ground select line in common.

In some embodiments of the inventive concept, ground select transistors of the same row may be connected to the same ground select line, and ground select transistors of different rows may be connected to different ground select lines. For example, the ground select transistors GSTa and GSTb of the cell strings CS11 and CS12 of the first row may be connected to a first ground select line, and the ground select transistors GSTa and GSTb of the cell strings CS21 and CS22 of the second row may be connected to a second ground select line.

Memory cells located at the same height (or order) from the substrate (or the ground select transistors GST) are connected to one word line in common, and memory cells located at different heights (or orders) are connected to different word lines respectively. For example, the memory cells MC1 are connected to a word line WL1 in common. The memory cells MC2 are connected to a word line WL2 in common. The memory cells MC3 are connected to a word line WL3 in common. The memory cells MC4 are connected to a word line WL4 in common. The memory cells MC5 are connected to a word line WL5 in common. The memory cells MC6 are connected to a word line WL6 in common.

Regarding the first string select transistors SSTa of the same height of the cell strings CS11~CS21 and CS12~CS22, the first string select transistors SSTa of different rows are connected to different string select lines SSL1*a* and SSL2*a* respectively. For example, the first string select transistors SSTa of the cell strings CS11 and CS12 are connected to the string select line SSL1*a* in common. The first string select transistors SSTa of the cell strings CS21 and CS22 are connected to the string select line SSL2*a* in common.

Regarding the second string select transistors SSTb of the same height of the cell strings CS11~CS21 and CS12~CS22, the second string select transistors SSTb of different rows are connected to different string select lines SSL1*b* and SSL2*b* respectively. For example, the second string select transistors SSTb of the cell strings CS11 and CS12 are connected to the string select line SSL1*b* in common. The second string select transistors SSTb of the cell strings CS21 and CS22 are connected to the string select line SSL2*b* in common.

That is, cell strings of different rows are connected to different string select lines. String select transistors of the same height (or order) of cell strings of the same row are connected to the same string select line. String select transistors of different heights (or orders) of cell strings of the same row are connected to different string select lines.

In some embodiments of the inventive concept, string select transistors of cell strings of the same row may be connected to one string select line in common. For example, the string select transistors SSTa and SSTb of the cell strings CS11 and CS12 of the first row may be connected to one string select line in common. The string select transistors SSTa and SSTb of the cell strings CS21 and CS22 of the second row may be connected to one string select line in common.

Columns of the cell strings CS11~CS21 and CS12~CS22 are connected to different bit lines BL1 and BL2 respectively. For example, the string select transistors SSTb of the cell strings CS11 and CS21 of the first column are connected to the bit line BL1 in common. The string select transistors SSTb of the cell strings CS12 and CS22 of the second column are connected to the bit line BL2 in common.

The cell strings CS11 and CS12 may form a first plane. The cell strings CS21 and CS22 may form a second plane.

In the memory block BLKa, write and read operations may be performed by a row unit. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2. That is, the second plane is selected. In the selected plane, one row of the memory cells MC may be selected by the word lines WL1~WL6. In the selected row, a read or write operation may be performed.

In the memory block BLKa, an erase operation may be performed by a block unit or a sub block unit. When an erase operation is performed by a memory block unit, all the memory cells MC of the memory block BLKa may be erased at the same time by one erase request. When an erase operation is performed by a sub block unit, a part of the memory cells MC may be erased at the same time by one erase request and the other part of the memory cells MC may be erase-prohibited. A low voltage (for example, a ground voltage) is supplied to a word line connected to memory cells to be erased, and a word line connected to erase-prohibited memory cells is floated.

The memory block BLKa illustrated in FIG. 3 is illustrative. The inventive concept is not limited to the memory block BLKa illustrated in FIG. 3. For example, in some embodiments of the inventive concept the number of rows of the cell strings may increase or decrease. As the number of rows of the cell strings is changed, the number of string select lines or ground select lines connected to rows of the cell strings and the number of cell strings connected to one bit line may also be changed.

In some embodiments of the inventive concept, the number of columns of the cell strings may increase or decrease. As the number of columns of the cell strings is changed, the number of bit lines connected to columns of the cell strings and the number of cell strings connected to one string select line may also be changed.

A height of the cell strings may increase or decrease. For example, the number of ground select transistors, memory cells and string select transistors stacked in the respective cell strings may increase or decrease.

In an embodiment of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the inventive concept, the 3D memory array includes vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure as the memory cells and being formed monolithically together with the memory cells.

U.S. Pat. Nos. 7,679,133; 8,553,466; 8,654,587; 8,559,235; and US Pat. Pub. No. 2011/0233648 are hereby incorporated by reference, and describe suitable configurations for three-dimensional memory arrays, in which the three-dimensional memory arrays are configured as a plurality of levels with word lines and/or bit lines shared between levels.

Figure 4:
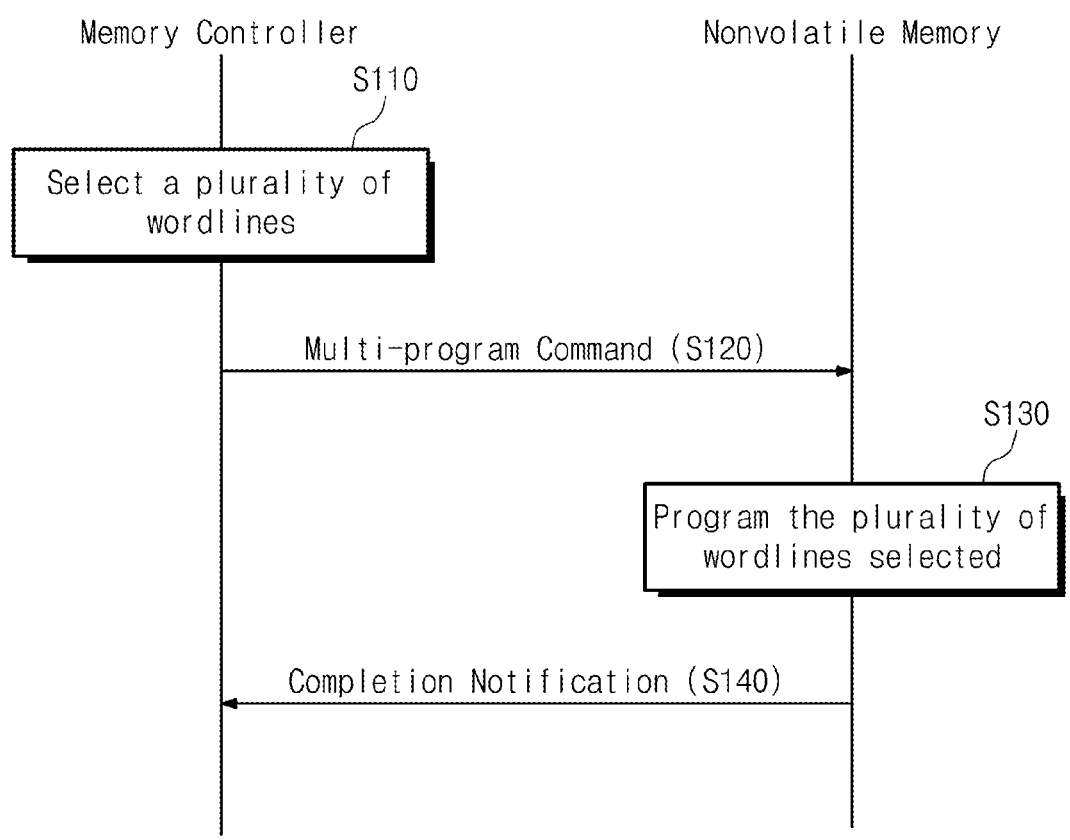
FIG. 4 is a flow chart illustrating an operation method of a storage device in accordance with some embodiments of the inventive concept.

FIG. 4 is a flow chart illustrating an operation method of a storage device in accordance with some embodiments of the inventive concept. Referring to FIGS. 1 and 4, in a step S110, the memory controller 120 selects a plurality of word lines. For example, the memory controller 120 selects a plurality of word lines having memory cells to be programmed through a multi-program operation.

In a step S120, the memory controller 120 transmits a multi-program command to the nonvolatile memory 110 as the first command CMD1. For example, along with the first command CMD1, the memory controller 120 transmits addresses indicating the selected word lines to the nonvolatile memory 110 as the first address ADDR1 sequentially. For example, the memory controller 120 may transmit the lowest address among addresses of the selected word lines and/or a count of the selected word lines to the nonvolatile memory 110 as the first address ADDR1. When transmitting the multi-program command as the first command CMD1, the memory controller 120 may not transmit the first data DATA1 related with the multi-program command to the nonvolatile memory 110. That is, the multi-program command may not include corresponding write data.

In the step S130, the nonvolatile memory 110 programs the selected word lines. For example, in a memory block (or sub block) corresponding to the first address ADDR1, the nonvolatile memory 110 performs a multi-program operation on word lines corresponding to the first address ADDR1 and/or addresses subsequent to the first address ADDR1.

In a step S140, the nonvolatile memory 110 notifies the memory controller 120 of completion of the multi-program operation. For example, the nonvolatile memory 110 notifies the memory controller 120 of completion of the multi-program operation by adjusting a ready & busy signal R/nB.

Figure 5:
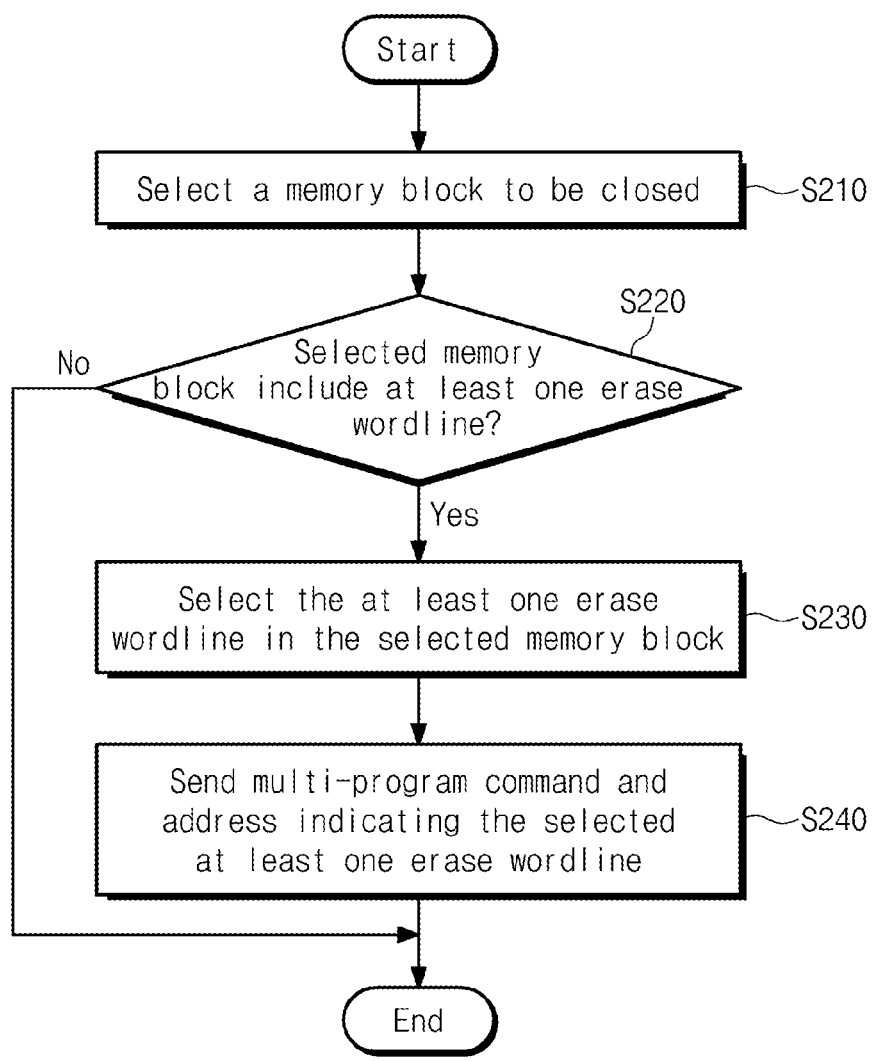
FIG. 5 is a flow chart illustrating a first example of a memory controller selecting word lines on which a multi-program operation is performed in accordance with some embodiments of the inventive concept.

FIG. 5 is a flow chart illustrating a first example of a memory controller 120 selecting word lines on which a multi-program operation is performed, in accordance with some embodiments of the inventive concept. Referring to FIGS. 1 and 5, in a step S210, the memory controller 120 selects a memory block to be closed. For example, in the case that the memory controller 120 selects a free block that is in an erase state as a data block in which data is to be written, the selected memory block may be designated as an open memory block. The memory controller 120 can write the first data DATA1 in the open memory block. The memory controller 120 may then prohibit the open memory block from being further programmed. A program-prohibited memory block may be designated as a closed memory block. Until the closed memory block is erased, a program operation with respect to the closed memory block is prohibited and a read operation may be allowed.

As a first example, if the first data DATA1 is written in all memory cells of the open memory block, the open memory block may then be closed (or designated as a closed memory block). As a second example, if a program error occurs while a program operation is performed on the open memory block, the open memory block may then be closed. As a third example, if a read error occurs while a read operation is performed on the open memory block, the open memory block may then be closed. As a fourth example, after data of a first memory block is copied to a second memory block by a read reclaim, the second memory block may be closed. As a fifth example, when valid data of the open memory block is copied to other memory block by a garbage collection and valid data does not exist in the open memory block, the open memory block may be closed.

In the case of the first example, an erase word line, that is a word line connected to memory cells not including data and maintaining an erase state, does not exist in the closed memory block. In the case of the second through fifth examples, an erase word line may exist in the closed memory block.

In a step S220, the memory controller 120 determines whether at least one erase word line exists in the selected memory block. If an erase word line does not exist in the selected memory block, the memory controller 120 closes the selected memory block without additional operation and the process ends. If an erase word line exists in the selected memory block, a step S230 is performed.

In the step S230, the memory controller 120 selects the at least one erase word line of the selected memory block as a target of a multi-program operation.

In a step S240, the memory controller 120 transmits a multi-program command and an address indicating the selected at least one erase word line to the nonvolatile memory 110 as the first command CMD1 and the first address ADDR1 respectively. When the multi-program operation is completed, the memory controller 120 closes the selected memory block and the process ends.

As the time that memory cells of the nonvolatile memory 110 are left in an erase state increases, a characteristic of memory cells is deteriorated. However, according to an embodiment of the inventive concept, when a memory block is closed, an erase word line is programmed by a multi-program command and therefore is not neglected. Thus, reliability of the nonvolatile memory 110 and the storage device 100 including the nonvolatile memory 110 is improved. A plurality of erase word lines are also concurrently programmed by the multi-program command. Accordingly, although a multi-program operation is performed on the erase word line, an operation speed of the nonvolatile memory 110 and the storage device 100 including the nonvolatile memory 110 is not impeded.

Figure 6:
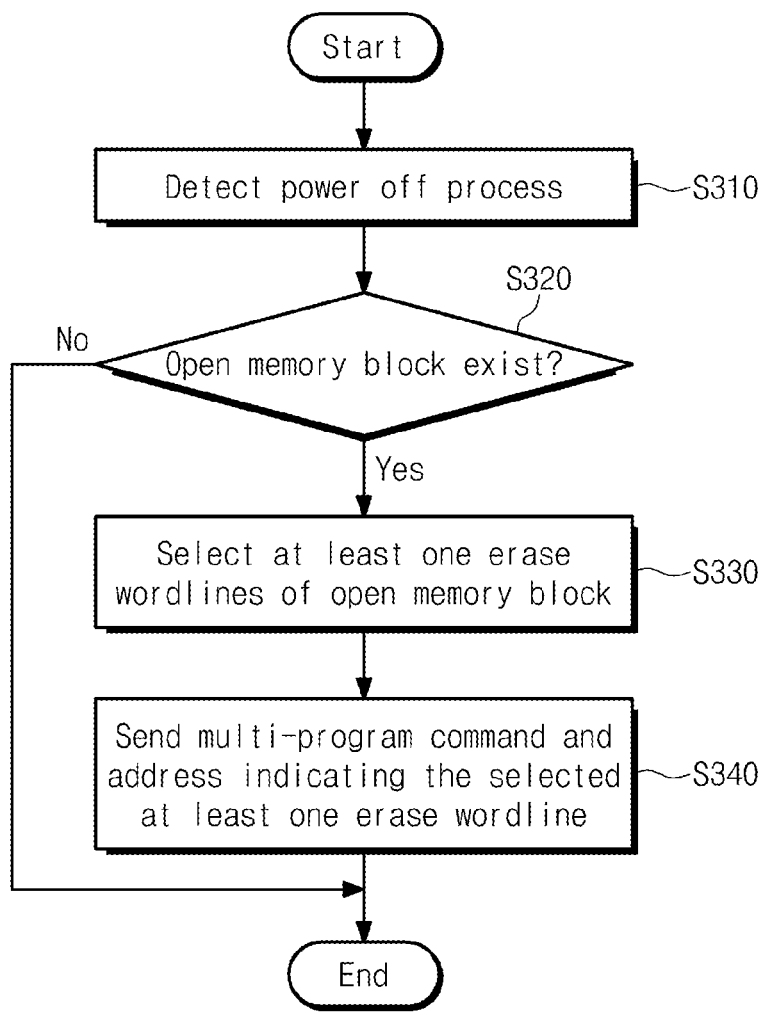
FIG. 6 is a flow chart illustrating a second example of a memory controller selecting word lines on which a multi-program operation is performed in accordance with some embodiments of the inventive concept.

FIG. 6 is a flow chart illustrating a second example of a memory controller 120 selecting word lines on which a multi-program operation is performed, in accordance with some embodiments of the inventive concept. Referring to FIGS. 1 and 6, in a step S310, the memory controller 120 detects a power off process. For example, the memory controller 120 may detect that an external host device performs a power off process. The memory controller 120 may receive a signal notifying power off from the external host device.

In a step S320, the memory controller 120 determines whether an open memory block exists. If an open memory block does not exist, the memory controller 120 is powered off without a multi-program operation and the process ends. If an open memory block exists, a step S330 is performed.

In the step S330, the memory controller 120 selects at least one erase word line of the open memory block. In a step S340, the memory controller 120 transmits a multi-program command and an address indicating the selected at least one erase word line to the nonvolatile memory 110 as the first command CMD1 and the first address ADDR1 respectively. When the multi-program operation is completed, the memory controller 120 notifies the external host device that the memory controller 120 is ready to be powered off, and the process ends.

An open memory block includes at least one erase word line. If the storage device 100 is powered off while an open memory block includes at least one erase word line, memory cells of the at least one erase word line are left in an erase state. According to an embodiment of the inventive concept, at least one erase word line of the open memory block is programmed by a multi-program operation before powering off. Thus, reliability of the nonvolatile memory 110 and the storage device 100 including the nonvolatile memory 110 is improved.

Figure 7:
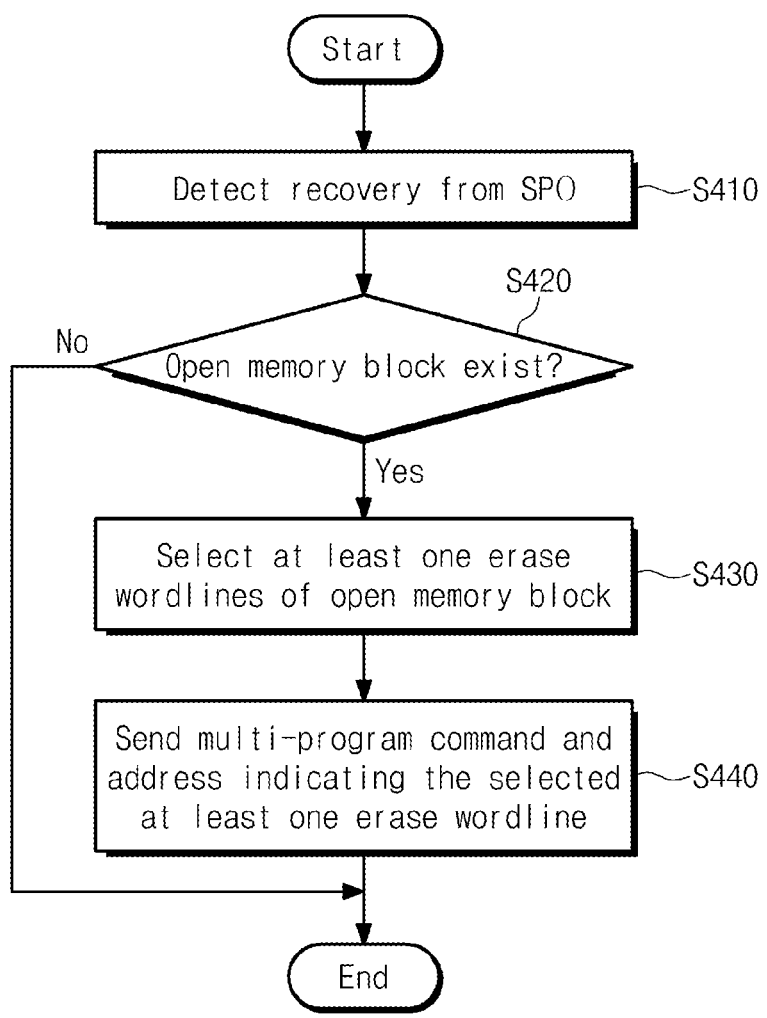
FIG. 7 is a flow chart illustrating a third example of a memory controller selecting word lines that will perform a multi-program operation in accordance with some embodiments of the inventive concept.

FIG. 7 is a flow chart illustrating a third example of a memory controller 120 selecting word lines on which a multi-program operation is performed, in accordance with some embodiments of the inventive concept. Referring to FIGS. 1 and 7, in a step S410, the memory controller 120 detects whether the storage device 100 is restored from a sudden power off (SPO). For example, the memory controller 120 may detect whether power is supplied to the storage device 100, after power of the storage device 100 is suddenly shut off. The memory controller 120 may detect whether the storage device 100 is restored from a sudden power off (SPO) with reference to meta data or user data stored in the nonvolatile memory 110.

In a step S420, the memory controller 120 determines whether an open memory block exists. If an open memory block does not exist, the memory controller 120 does not perform a multi-program operation and the process ends. When an open memory block exists, a step S430 is performed.

In step S430, the memory controller 120 selects at least one erase word line of the open memory block. In a step S440, the memory controller 120 transmits a multi-program command and an address indicating the selected at least one erase word line to the nonvolatile memory 110 as the first command CMD1 and the first address ADDR1 respectively. When the multi-program operation is completed, the memory controller 120 closes the open memory block on which the multi-program operation is performed, and the process ends.

An open memory block includes at least one erase word line. While power is not supplied to the storage device 100 because of the SPO, memory cells of the at least one erase word line of the open memory block are left in an erase state. According to an embodiment of the inventive concept, in the case of being restored from the SPO, a multi-program operation is performed on the open memory block and the open memory block on which the multi-program operation is performed is thereafter closed. Thus, the first data DATA1 is prevented from being written in deteriorated memory cells and reliability of the nonvolatile memory 110 and the storage device 100 including the nonvolatile memory 110 is improved.

Figure 8:
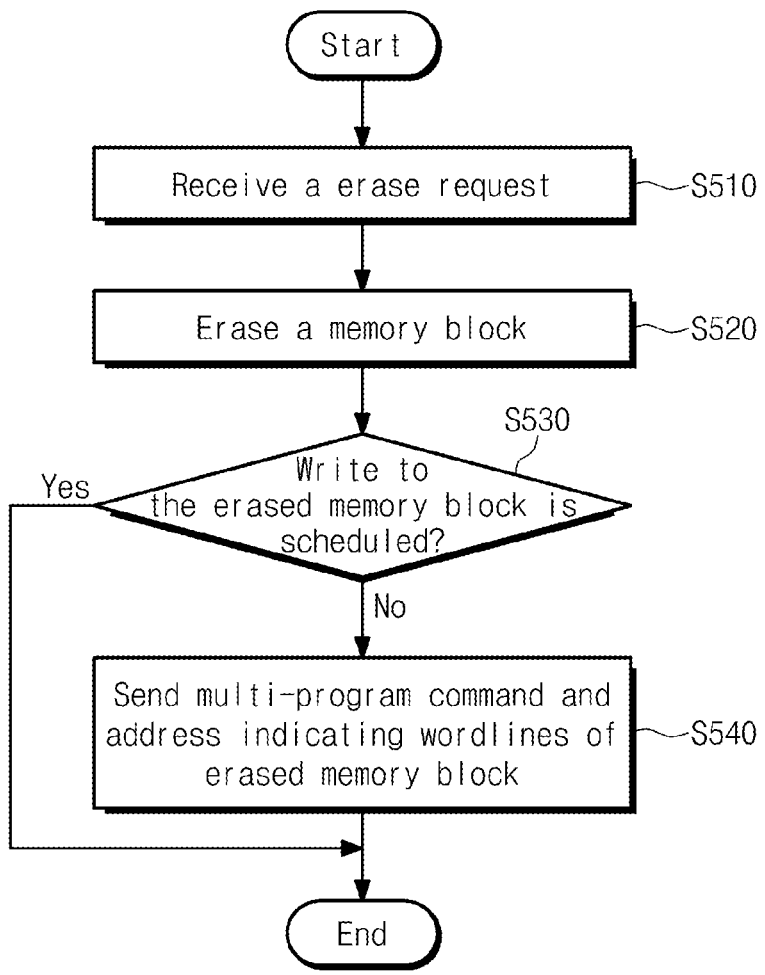
FIG. 8 is a flow chart illustrating a fourth example of a memory controller selecting word lines on which a multi-program operation is performed in accordance with some embodiments of the inventive concept.

FIG. 8 is a flow chart illustrating a fourth example of a memory controller 120 selecting word lines on which a multi-program operation is performed, in accordance with some embodiments of the inventive concept. Referring to FIGS. 1 and 8, in a step S510, the memory controller 120 receives an erase request from an external host device. In a step S520, the memory controller 120 erases an erase-requested memory block.

In a step S530, the memory controller 120 determines whether a write operation with respect to the erased memory block is scheduled. If a write operation with respect to the erased memory block is scheduled, the memory controller 120 does not perform a multi-program operation and the process ends. If a write operation with respect to the erased memory block is not scheduled, a step S540 is performed.

In step S540, the memory controller 120 transmits a multi-program command and an address indicating the erased memory block to the nonvolatile memory 110 as the first command CMD1 and the first address ADDR1 respectively.

A memory block erased by a request of an external host device is left in an erase state until data is written. According to an embodiment of the inventive concept, if a write operation of the memory block erased by a request of the external host device is not scheduled, a multi-program operation is performed on the erased memory block. Thus, reliability of the nonvolatile memory 110 and the storage device 100 including the nonvolatile memory 110 is improved.

In the embodiments of FIGS. 4 through 8, the memory controller 120 transmits a multi-program command to the nonvolatile memory 110. The memory controller 120 may schedule an operation of transmitting a multi-program command and may transmit the multi-program command to the nonvolatile memory 110 during an idle state of the storage device 100 when the storage device 100 does not perform an operation requested by a host.

Figure 9:
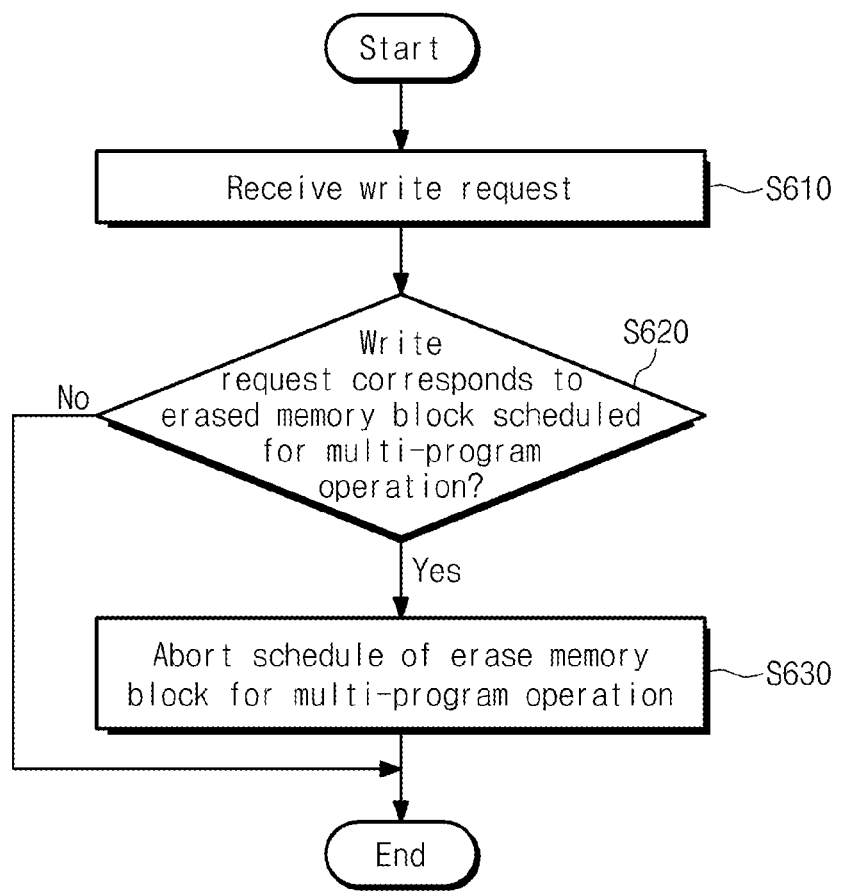
FIG. 9 is a flow chart illustrating an application example of an embodiment described with reference to FIG. 8.

FIG. 9 is a flow chart illustrating an application example of an embodiment described with reference to FIG. 8. Referring to FIGS. 1, 8 and 9, in a step S610, the memory controller 120 receives a write request from an external host device.

In a step S620, the memory controller 120 determines whether a write request corresponds to an erase memory block in which a multi-program operation is scheduled. When a write request corresponds to an erase memory block in which a multi-program operation is scheduled, in a step S630 the memory controller 120 cancels the scheduled multi-program operation of the erase memory block. When it is determined in step S620 that the write request does not correspond to the erase block in which the multi-program operation is scheduled, the memory controller 120 does not cancel the scheduled multi-program operation of the erase memory block.

Figure 10:
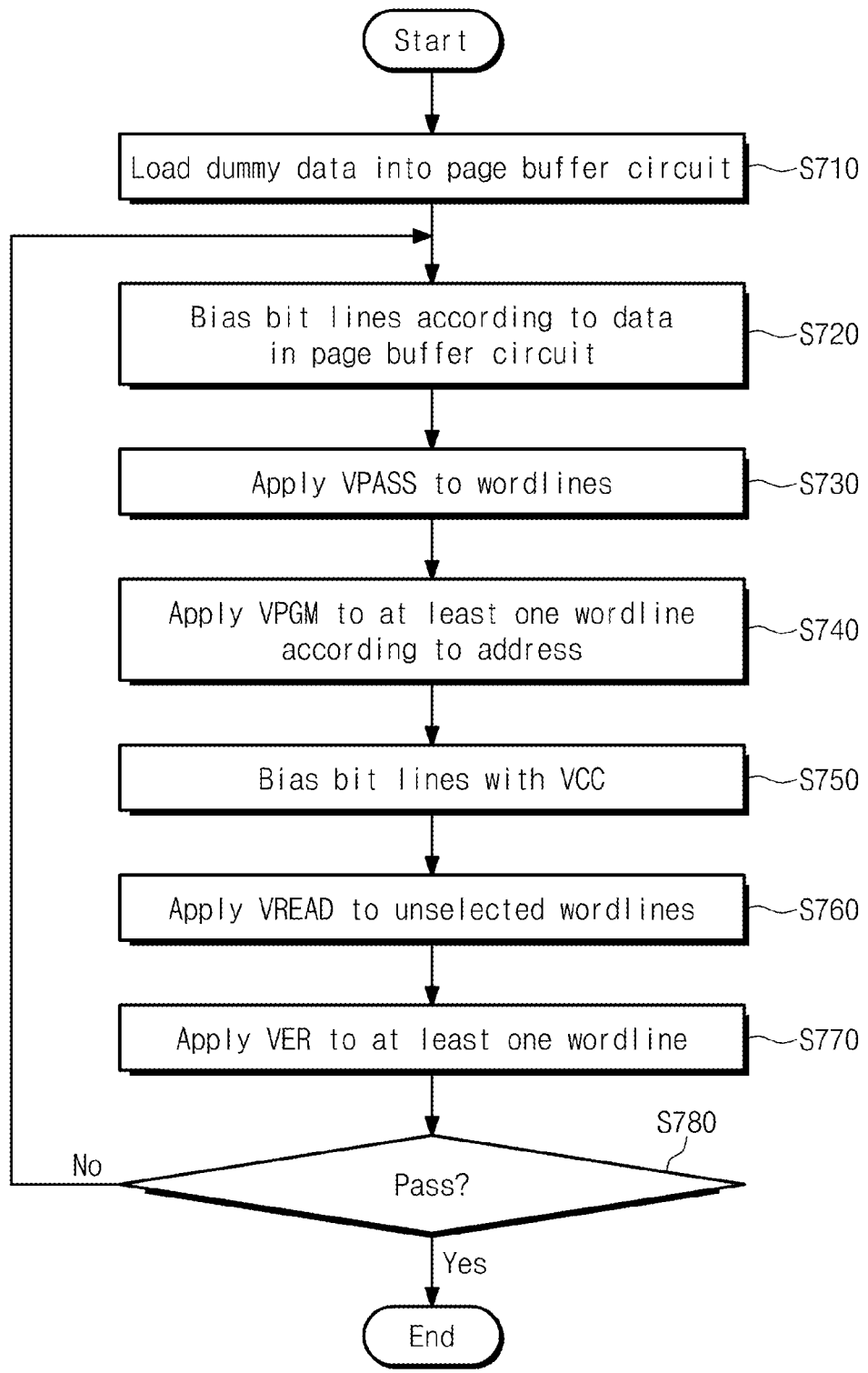
FIG. 10 is a flow chart illustrating a first example of a nonvolatile memory performing a multi-program operation in accordance with some embodiments of the inventive concept.

FIG. 10 is a flow chart illustrating a first example of a nonvolatile memory performing a multi-program operation in accordance with some embodiments of the inventive concept. Referring to FIGS. 1, 2, 3 and 10, in a step S710, dummy data is loaded into a page buffer circuit 115. For example, dummy data may be loaded which programs memory cells of an erase word line to a program state (for example, a padding program state) having a threshold voltage distribution range larger than a threshold voltage distribution range of an erase state. The dummy data may be received from the memory controller 120 or may be generated in the nonvolatile memory 110.

In a step S720, the page buffer circuit 115 biases bit lines BL according to data loaded into the page buffer circuit 115. For example, in an initial state that dummy data is loaded into the page buffer circuit 115, the page buffer circuit 115 biases the bit lines BL to a ground voltage.

In a step S730, the address decoder circuit 113 applies a pass voltage VPASS to word lines WL1~WL6. The pass voltage VPASS may be a high voltage turning memory cells MC on.

In a step S740, the address decoder circuit 113 applies a program voltage VPGM to at least one erase word line which the first address ADDR1 indicates. In the case that the number of erase word lines is two or more, the address decoder circuit 113 applies a program voltage VPGM to two or more erase word lines at the same time. That is, memory cells MC connected to two or more erase word lines are programmed at the same time.

The steps S720 through S740 can form a program sequence of a program loop.

In a step S750 the page buffer circuit 115 biases bit lines BL to a power supply voltage.

In a step S760, the address decoder circuit 113 applies a read voltage VREAD to unselected word lines not corresponding to the first address ADDR1. The read voltage VREAD may be a high voltage that turns memory cells MC on.

In a step S770, the address decoder circuit 113 applies a verification voltage VER to at least one erase word line indicated by the first address ADDR1. For example, in the case that the number of erase word lines is two or more, the address decoder circuit 113 simultaneously applies a verification voltage VER to two or more erase word lines. That is, memory cells MC connected to two or more erase word lines are verified at the same time.

The steps S750 through S770 can form a verification sequence of a program loop.

In a step S780, it is determined whether memory cells connected to an erase word line are program-passed. If the memory cells are not program-passed, a program voltage increases and in the step S720, a next program loop is performed. If the memory cells are program-passed, a multi-program operation is finished and the process ends.

Figure 11:
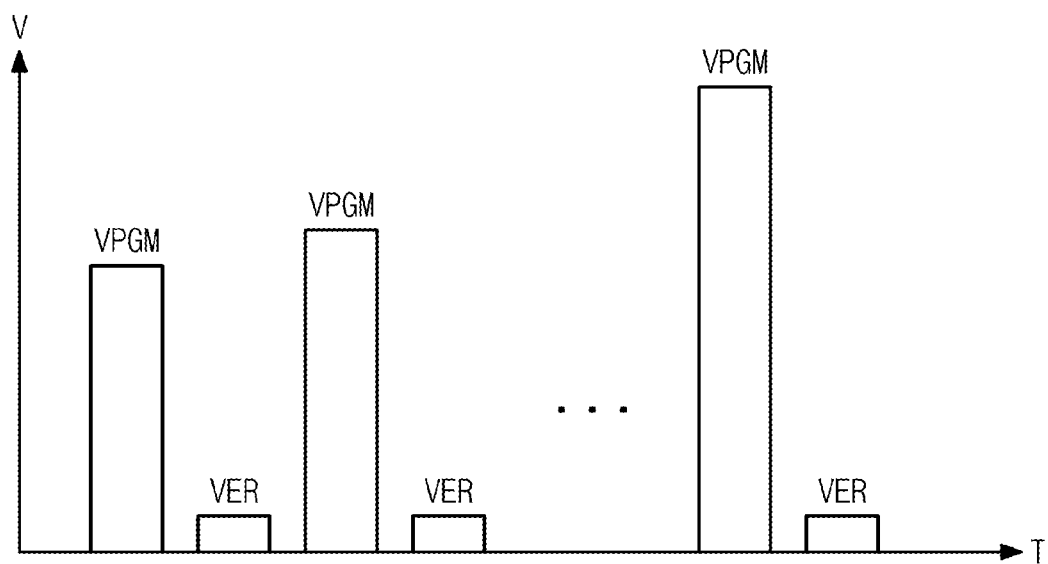
FIG. 11 is a graph illustrating a first example of a voltage applied to at least one erase word line when a program loop is performed in accordance with some embodiments of the inventive concept.

FIG. 11 is a graph illustrating a first example of a voltage applied to at least one erase word line when a program loop is performed, in accordance with some embodiments of the inventive concept. In FIG. 11, a horizontal axis indicates time (T) and a vertical axis indicates a voltage (V). Referring to FIG. 11, after a program voltage VPGM is applied to at least one erase word line, a verification voltage VER is applied to the at least one erase word line. Whenever a program loop is repeated, a level of the program voltage VPGM increases.

When the program voltage VPGM is applied, memory cells MC connected to a plurality of erase word lines are programmed at the same time. When the verification voltage VER is applied, the memory cells MC connected to the plurality of erase word lines may be verified at the same time. The memory cells MC connected to the plurality of erase word lines may be verified by a word line unit. In this case, in each program loop, after the program voltage VPGM is applied, the verification voltage VER may be applied as many as the number of erase word lines.

Figure 12A:
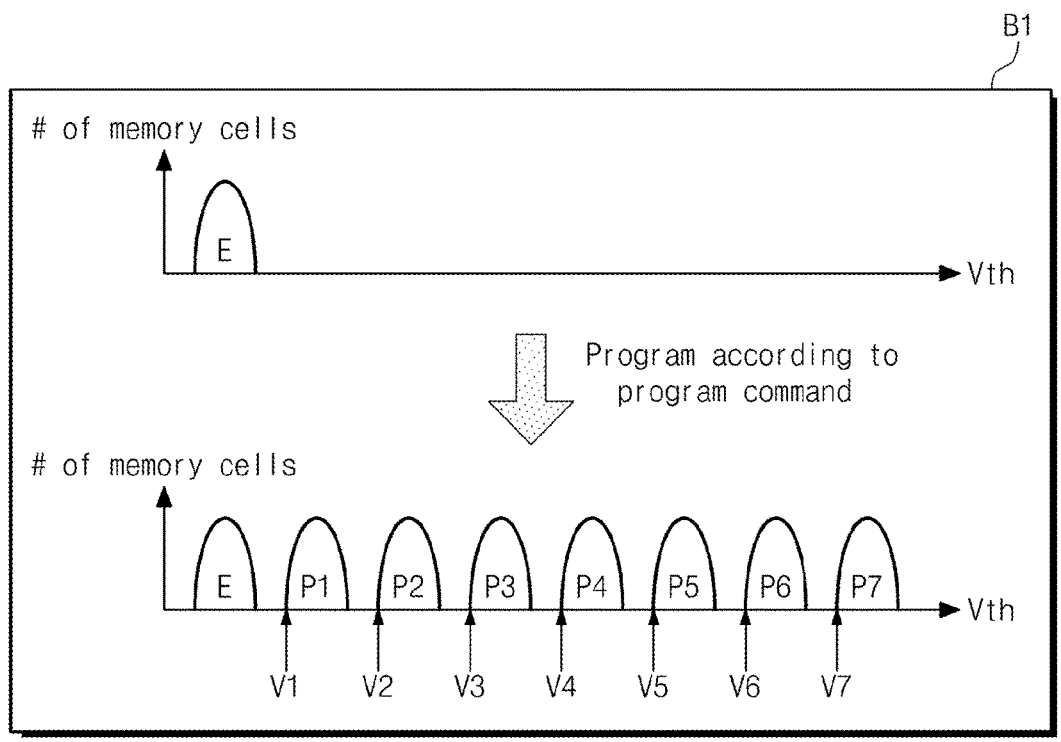
FIGS. 12A and 12B illustrate graphs showing an example of a threshold voltage change of memory cells in accordance with some embodiments of the inventive concept.
Figure 12B:
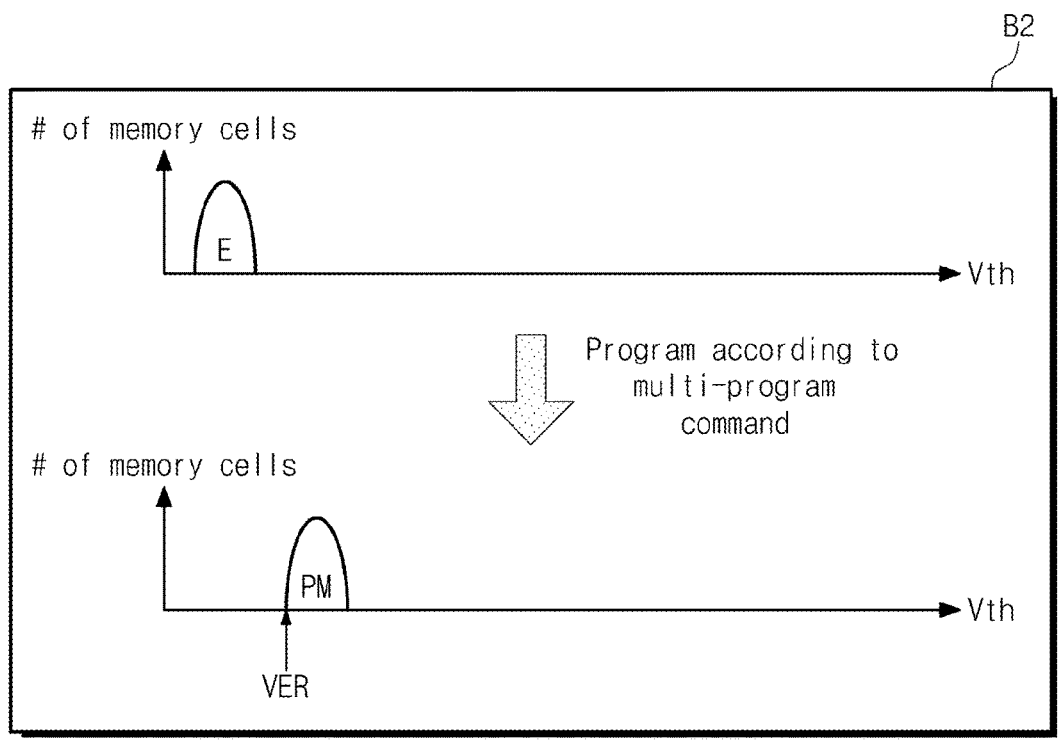

FIGS. 12A and 12B illustrate graphs showing an example of a threshold voltage change of memory cells. In FIGS. 12A and 12B, the horizontal axes indicate a threshold voltage and the vertical axes indicate the number of memory cells. That is, in FIGS. 12A and 12B, a distribution of threshold voltages of the memory cells MC is illustrated.

In FIG. 12A, when a program operation is performed according to a program command, a change of a threshold voltage distribution of memory cells MC is illustrated. The memory cells MC are programmed to have an erase state E and first through seventh program states P1~P7 from the erase state E. The first through seventh program states P1~P7 may be verified using first through seventh voltages V1~V7 respectively.

In FIG. 12B, when a multi-program operation is performed according to a multi-program command, a change of a threshold voltage distribution of memory cells MC is illustrated. The memory cells MC are programmed from an erase state E to a padding program state PM. The padding program state PM may be verified using a verification voltage VER. A threshold voltage distribution range of the padding program state PM is higher than a threshold voltage distribution range of the erase state E. The padding program state PM may be distributed around a ground voltage.

Figure 13A:
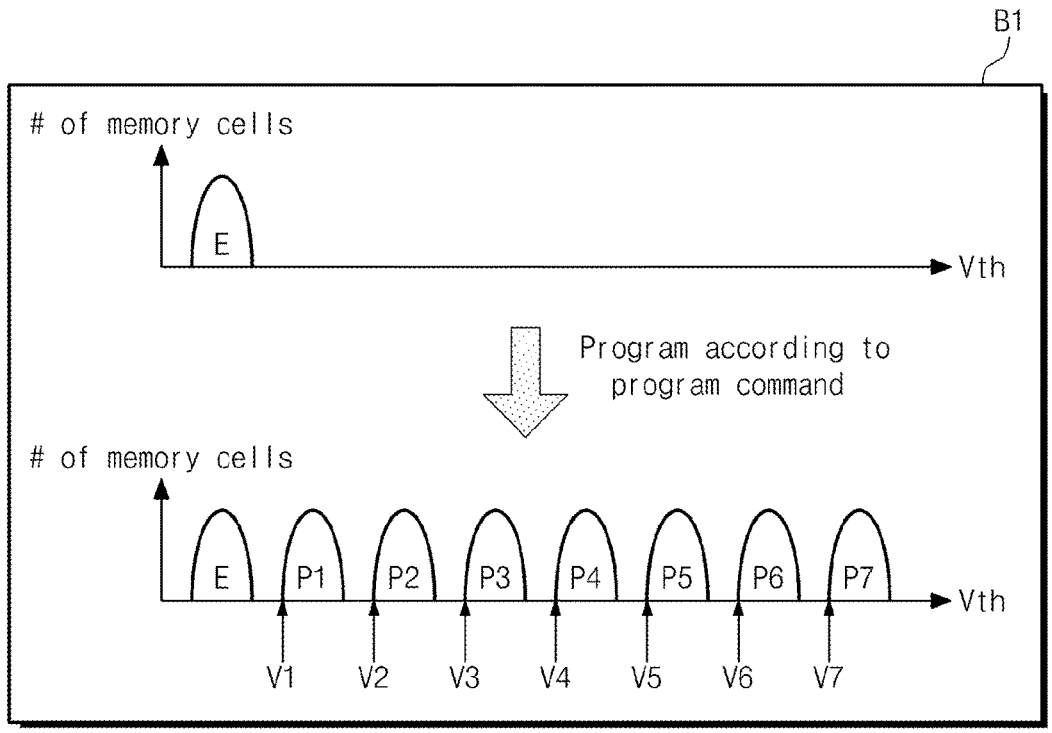
FIGS. 13A and 13B illustrate graphs showing another example of a threshold voltage change of memory cells in accordance with some embodiments of the inventive concept.
Figure 13B:
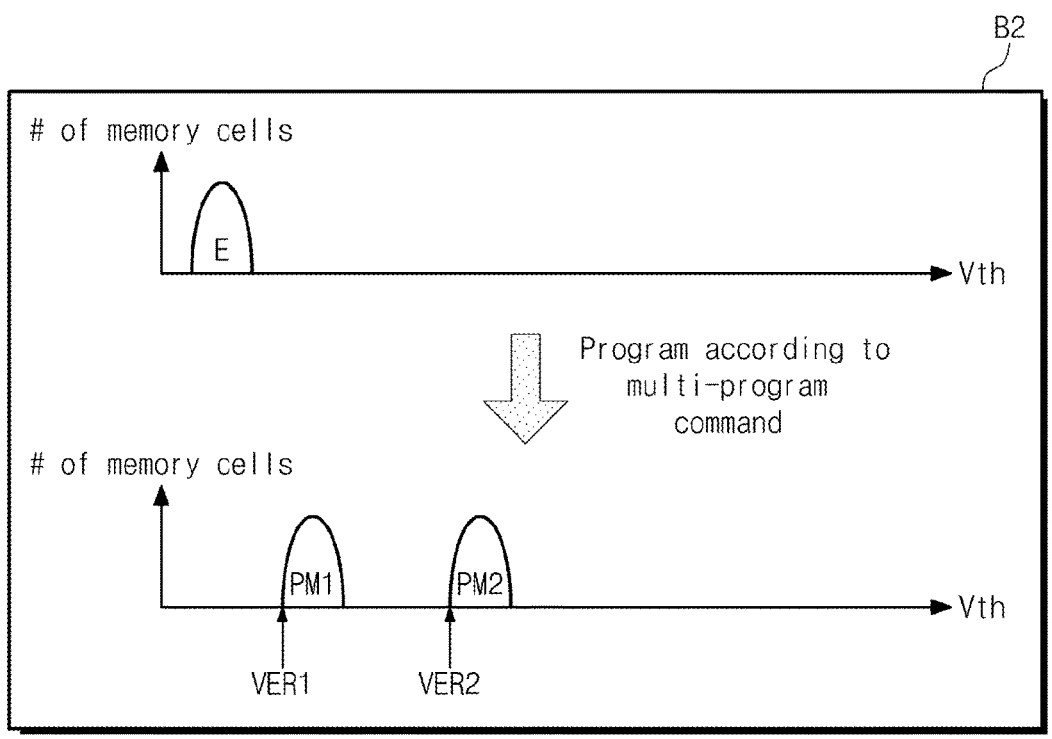

FIGS. 13A and 13B illustrate graphs showing another example of a threshold voltage change of memory cells. In FIGS. 13A and 13B, the horizontal axes indicate a threshold voltage and the vertical axes indicate the number of memory cells. That is, in FIGS. 13A and 13B, a distribution of threshold voltages of the memory cells MC is illustrated.

In FIG. 13A, when a program operation is performed according to a program command, a change of a threshold voltage distribution of memory cells MC is illustrated. The memory cells MC are programmed to have an erase state E and first through seventh program states P1~P7 from the erase state E. The first through seventh program states P1~P7 may be verified using first through seventh voltages V1~V7 respectively.

In FIG. 13B, when a multi-program operation is performed according to a multi-program command, a change of a threshold voltage distribution of memory cells MC is illustrated. The memory cells MC are programmed from an erase state E to a first padding program state PM1 and a second padding program state PM2. The first padding program state PM1 may be verified using a first verification voltage VER1. A threshold voltage distribution range of the first padding program state PM1 is higher than a threshold voltage distribution range of the erase state E. The second padding program state PM2 may be verified using a second verification voltage VER2. A threshold voltage distribution range of the second padding program state PM2 is higher than a threshold voltage distribution range of the erase state E.

Among erase word lines, at least one first erase word line may be programmed to the first padding program state PM1 and at least one second erase word line may be programmed to the second padding program state PM2. For example, in some embodiments of the inventive concept the second erase word line may be located closer to the ground select line GSL (refer to FIG. 3) compared with the first erase word line.

When the number of erase word lines is at least two, a first multi-program operation may be performed by performing a verification using the first verification voltage VER1. The first multi-program operation may be performed according to the method described in FIG. 10. After the first multi-program operation using the first verification voltage VER1 is completed, a second multi-program operation may be performed using the second verification voltage VER2. The second multi-program operation may be performed according to the method described in FIG. 10, but may be performed only on a closest erase word line (for example, an erase word line having the lowest address) to the ground select line GSL among the erase word lines.

The number of the padding program states is not limited to one or two. In some embodiments of the inventive concept, the number of the padding program states may be N (N is a positive integer). An erase word line closest to the ground select line GSL among erase word lines may be programmed to an N padding program state. An erase word line second-closest to the ground select line GSL among erase word lines may be programmed to an N-1 padding program state. An erase word line Kth-closest to the ground select line GSL among erase word lines may be programmed to an N-K padding program state. A threshold voltage distribution range of the Kth padding program state may be greater than a threshold voltage distribution range of the K-1th padding program state. The remaining erase word lines except first through Nth erase word lines adjacent to the ground select line GSL may be programmed in the first padding program state.

The first through Nth padding program states may be verified using first through Nth verification voltages respectively. Using the first verification voltage, memory cells connected to the erase word lines may be programmed to the first padding program state. After that, using the second verification voltage, memory cells of the first through N-1th word lines may be multi-programmed. After that, using the Kth verification voltage, memory cells of the first through N-K+1th erase word lines may be multi-programmed.

Figure 14:
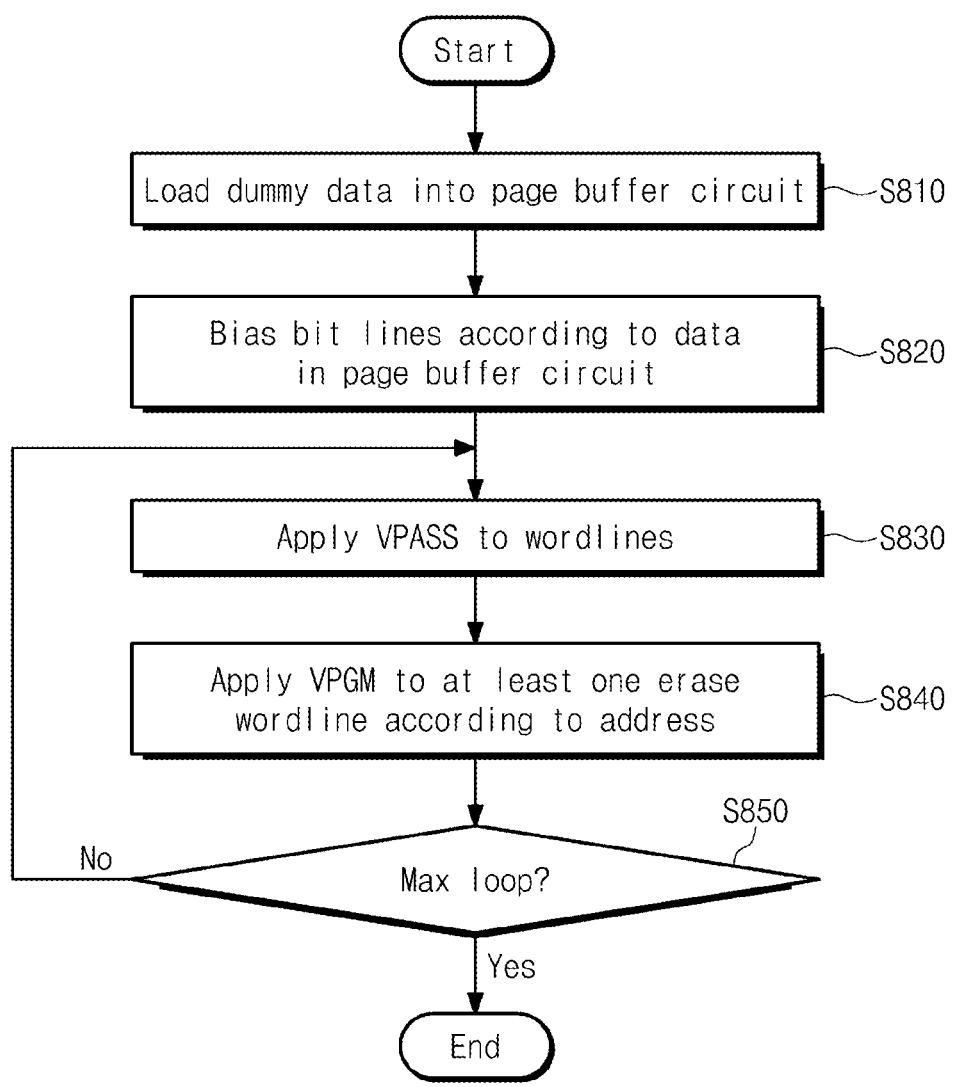
FIG. 14 is a flow chart illustrating a second example of a nonvolatile memory performing a multi-program operation in accordance with some embodiments of the inventive concept.

FIG. 14 is a flow chart illustrating a second example of a nonvolatile memory performing a multi-program operation in accordance with some embodiments of the inventive concept. Referring to FIGS. 1, 2, 3 and 14, in a step S810, dummy data is loaded into the page buffer circuit 115. For example, dummy data is loaded which programs memory cells of the erase word line in the padding program state having a threshold voltage distribution range greater than a threshold voltage distribution range of the erase state. The dummy data may be received from the memory controller 120 or may be generated in the nonvolatile memory 110.

In a step S820, the page buffer circuit 115 biases bit lines BL according to the dummy data loaded into the page buffer circuit 115. For example, the page buffer circuit 115 biases the bit lines BL to the ground voltage.

In a step S830, the address decoder circuit 113 applies a pass voltage VPASS to the word lines WL1~WL6. In step S840, the address decoder circuit 113 applies a program voltage VPGM to at least one erase word line indicated by the first address ADDR1. The steps S830 and S840 can form a program loop.

In a step S850, the control logic circuit 119 determines whether the program loop is maximally performed. When the program loop is maximally performed, a multi-program operation is finished and the process ends. When it is determined in step S850 that the program loop is not maximally performed, in the step S830 a next program loop is performed. When the next loop is performed, a level of the program voltage VPGM may increase.

Figure 15:
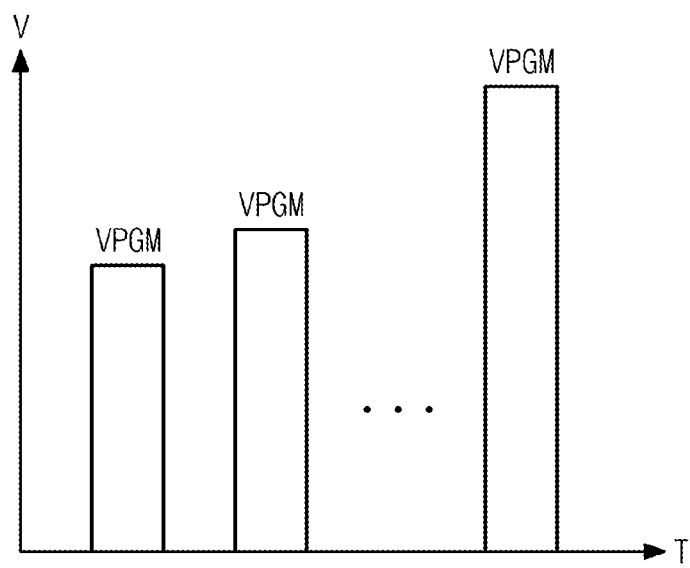
FIG. 15 is a graph illustrating a second example of a voltage applied to at least one erase word line when a program loop is performed in accordance with some embodiments of the inventive concept.

FIG. 15 is a graph illustrating a second example of a voltage applied to at least one erase word line when a program loop is performed in accordance with some embodiments of the inventive concept. In FIG. 15, a horizontal axis indicates time (T) and a vertical axis indicates a voltage (V). Referring to FIG. 15, after a program voltage VPGM is applied to at least one erase word line, a next program voltage VPGM is applied. When the program voltage VPGM is applied, memory cells MC connected to a plurality of erase word lines are programmed at the same time.

According to the embodiment described with reference to FIGS. 14 and 15, the nonvolatile memory 110 does not perform a verification operation when a multi-program operation is performed. The nonvolatile memory 110 performs the multi-program operation by applying a program voltage VPGM which increases in a step shape to the erase word lines as many as a predetermined number of times.

After each program loop is performed, voltages of the word lines WL1~WL6 may be discharged.

As described with reference to FIG. 13, memory cells of the erase word lines may be programmed to a plurality of padding program states. For example, in an embodiment of the inventive concept, in the multi-program operation the program voltage VPGM may be applied more times to an erase word line adjacent to the ground select line GSL compared with other erase word lines.

Figure 16:
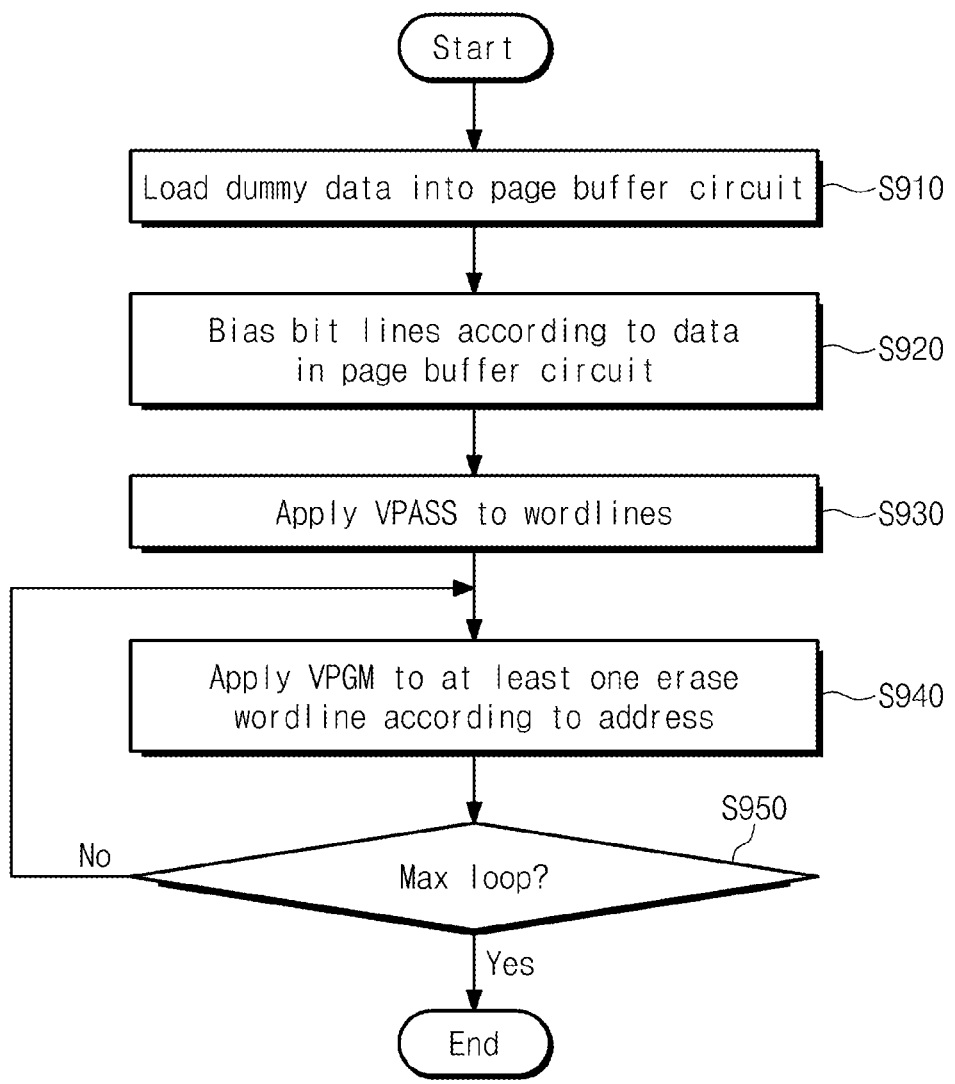
FIG. 16 is a flow chart illustrating a third example of a nonvolatile memory performing a multi-program operation in accordance with some embodiments of the inventive concept.

FIG. 16 is a flow chart illustrating a third example of a nonvolatile memory performing a multi-program operation, in accordance with some embodiments of the inventive concept. Referring to FIGS. 1, 2, 3 and 16, in a step S910, dummy data is loaded into the page buffer circuit 115. For example, dummy data is loaded which programs memory cells of the erase word line to the padding program state having a threshold voltage distribution range greater than a threshold voltage distribution range of the erase state. The dummy data may be received from the memory controller 120 or may be generated in the nonvolatile memory 110.

In a step S920, the page buffer circuit 115 biases bit lines BL according to the dummy data loaded into the page buffer circuit 115. For example, the page buffer circuit 115 biases the bit lines BL to the ground voltage.

In a step S930, the address decoder circuit 113 applies a pass voltage VPASS to the word lines WL1~WL6. In step S940, the address decoder circuit 113 applies a program voltage VPGM to at least one erase word line indicated by the first address ADDR1. The step S940 can form a program loop.

In a step S950, the control logic circuit 119 determines whether the program loop is maximally performed. When the program loop is maximally performed, a multi-program operation is finished and the process ends. When it is determined in step S950 that the program loop is not maximally performed, in the step S940, a next program loop is performed. When the next loop is performed, a level of the program voltage VPGM may increase.

Voltages applied to the erase word lines may be the same as those illustrated in FIG. 15. Voltages of word lines other than the erase word lines may be maintained at a pass voltage VPASS while the program loop is repeated. In each program loop, the program voltage VPGM is applied to the erase word lines and the erase word lines may be discharged. Voltages applied to the erase word lines may be changed as illustrated in FIG. 17.

Figure 17:
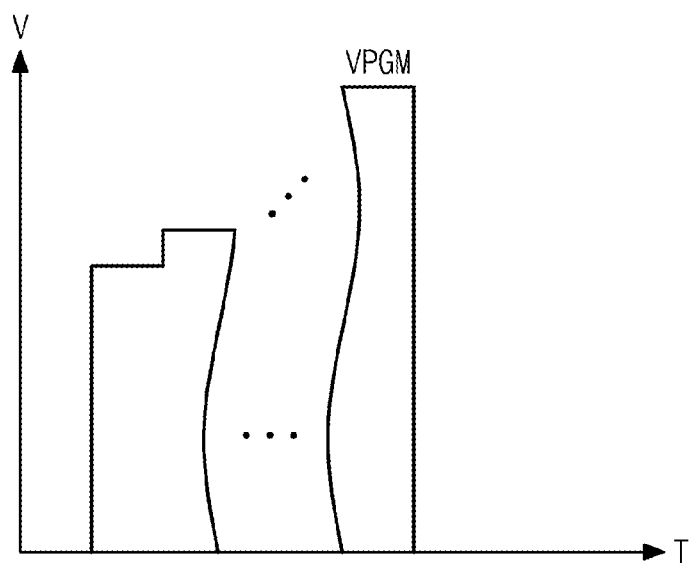
FIG. 17 is a graph illustrating a third example of a voltage applied to at least one erase word line when a program loop is performed in accordance with some embodiments of the inventive concept.

FIG. 17 is a graph illustrating a third example of a voltage applied to at least one erase word line when a program loop is performed in accordance with some embodiments of the inventive concept. In FIG. 17, a horizontal axis indicates time (T) and a vertical axis indicates a voltage (V). Referring to FIG. 17, a level of the program voltage VPGM may increase in a step shape. While the program loop is repeated, the program voltage VPGM applied to the erase word lines increases in a step shape. While the program loop is repeated, a voltage of the remaining word lines other than the erase word lines may be maintained at the pass voltage VPASS.

As described with reference to FIG. 13, memory cells of the erase word lines may be programmed in a plurality of padding program states. In accordance with embodiments of the inventive concept, in the multi-program operation, the program voltage VPGM may be applied more times to an erase word line adjacent to the ground select line GSL compared with other erase word lines.

Figure 18:
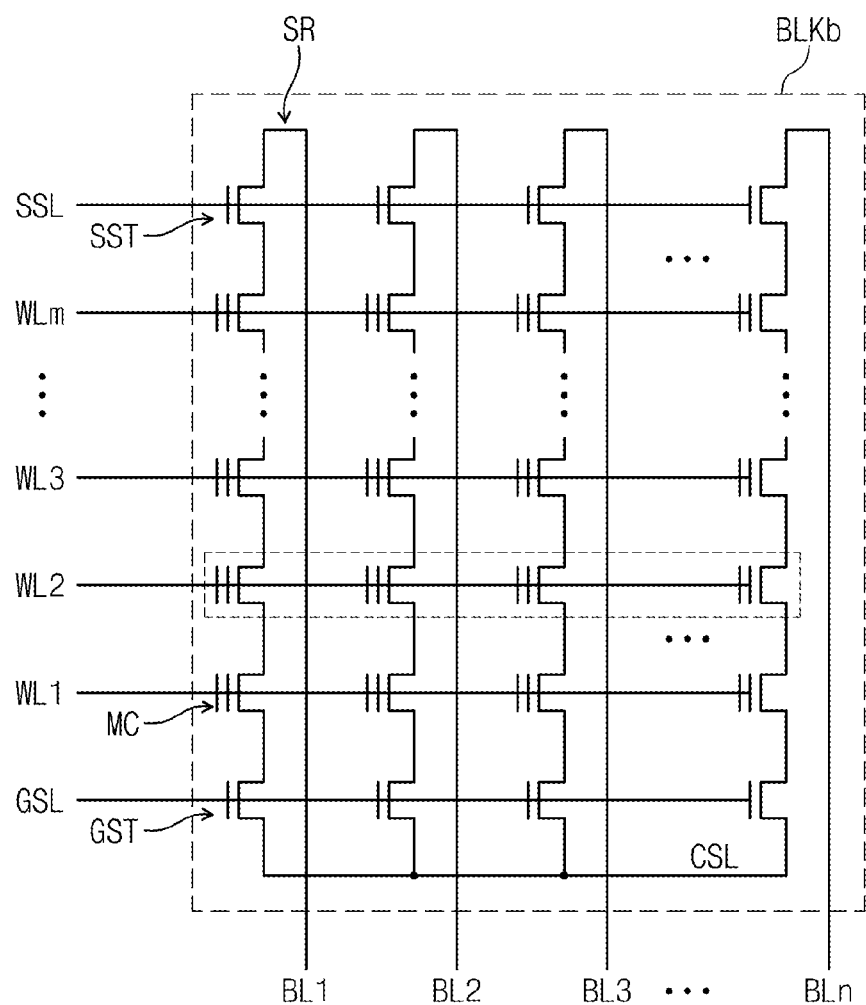
FIG. 18 is a circuit illustrating a memory block in accordance with another embodiment of the inventive concept.

FIG. 18 is a circuit diagram illustrating a memory block BLKb in accordance with some other embodiments of the inventive concept. Referring to FIG. 18, the memory block BLKb includes a plurality of strings SR. The strings SR are connected to a plurality of bit lines BL1~BLn respectively. Each string SR includes a ground select transistor GST, memory cells MC and a string select transistor SST.

The ground select transistor GST of each string SR is connected between the memory cells MC and a common source line CSL. The ground select transistors GST of the strings SR are connected to the common source line CSL in common.

The string select transistor SST of each string SR is connected between the memory cells MC and a corresponding bit line BL. The string select transistors SST of the strings SR are connected to the bit lines BL1~BLn respectively.

In each string SR, the memory cells MC are provided between the ground select transistor GST and the string select transistor SST. In each string SR, the memory cells MC are serially connected to one another.

In the strings SR, memory cells MC located at the same order from the common source line CSL are connected to one corresponding word line in common. Memory cells MC of the strings SR are connected to a plurality of word lines WL1~WLm.

In the memory block BLKb, an erase operation may be performed by a memory block unit. When an erase operation is performed by a memory block unit, all the memory cells MC of the memory block BLKb may be erased at the same time by one erase request.

Figure 19:
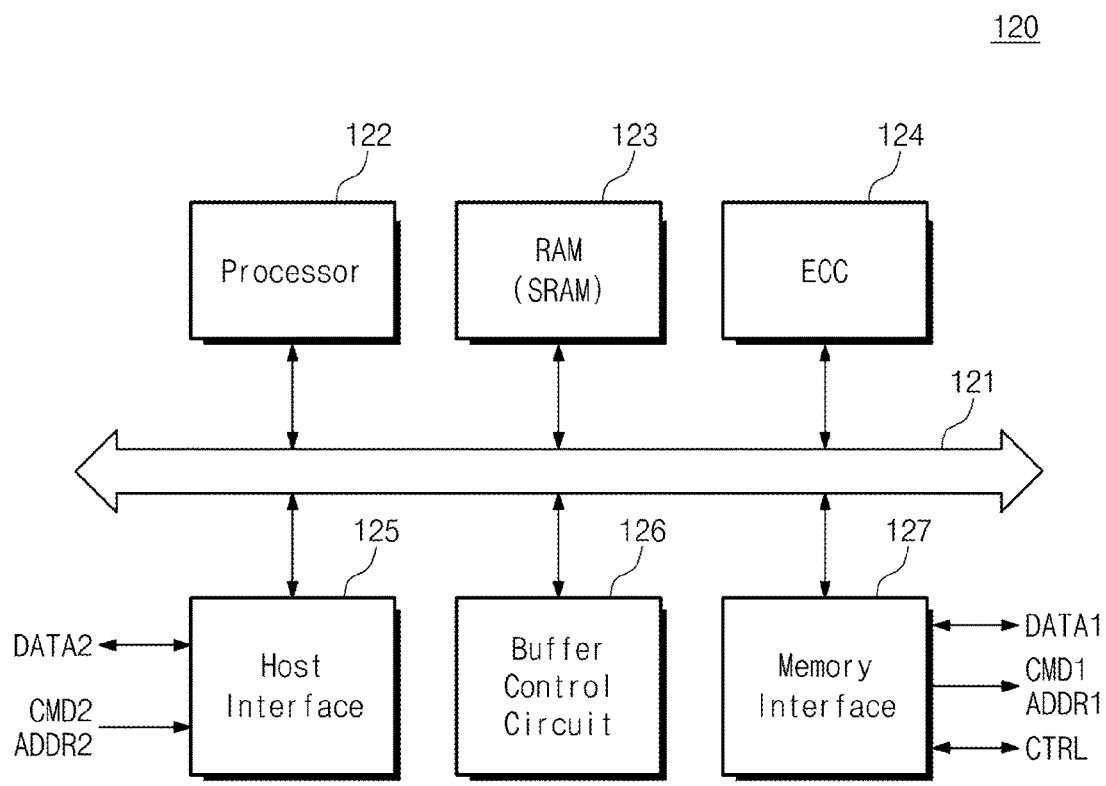
FIG. 19 is a block diagram illustrating a memory controller in accordance with an embodiment of the inventive concept.

FIG. 19 is a block diagram illustrating a memory controller 120 in accordance with some embodiments of the inventive concept. Referring to FIG. 19, the memory controller 120 includes a bus 121, a processor 122, a RAM 123, an error correction block 124, a host interface 125, a buffer control circuit 126, and a memory interface 127.

The bus 121 is configured to provide a channel between constituent elements of the memory controller 120.

The processor 122 controls an overall operation of the memory controller 120 and performs a logical operation. The processor 122 communicates with an external host device (not shown) through the host interface 125. The processor 122 may store a second command CMD2 or a second address ADDR2 received through the host interface 125 in the RAM 123. The processor 122 may generate a first command CMD1 and a first address ADDR1 according to the second command CMD2 or the second address ADDR2, and may output the generated first command CMD1 and the first address ADDR1 through the memory interface 127.

The processor 122 may output the second data DATA2 received through the host interface 125 through the buffer control circuit 126, or may store the second data DATA2 received through the host interface 125 in the RAM 123. Through the memory interface 127, the processor 122 may output data stored in the RAM 123 or data received through the buffer control circuit 126 as first data DATA1. The processor 122 may store the first data DATA1 received through the memory interface 127 in the RAM 123 or may output the first data DATA1 through the buffer control circuit 126. The processor 122 may output data stored in the RAM 123 or data received through the buffer control circuit 126 through the host interface 125 as second data DATA2 or may output the data through the memory interface 127 as the first data DATA1.

The RAM 123 may be used as an operation memory, a cache memory or a buffer memory. The RAM 123 may store codes or commands which the processor 122 executes. The RAM 123 may store data processed by the processor 122. The RAM 123 may include a static RAM (SRAM).

The error correction block 124 may correct errors in the data. The error correction block 124 may generate an error correction code (for example, parity) for performing an error correction on the basis of the first data DATA1 to be output to the memory interface 127 or the second data DATA2 received from the host interface 125. The first data DATA1 and the parity may be output through the memory interface 127. The error correction block 124 may perform an error correction of the received first data DATA1 using the first data DATA1 and the parity received through the memory interface 127. The error correction block 124 may be included in the memory interface 127 as a constituent element.

The host interface 125 is configured to communicate with an external host device under the control of the processor 122. The host interface 125 receives the second command CMD2 and the second address ADDR2 from the external host device and exchanges the second data DATA2 with the external host device.

The host interface 125 may be configured to communicate using at least one of various communication methods such as universal serial bus (USB), serial AT attachment (SATA), serial attached SCSI (SAS), high speed interchip (HSIC), small computer small interface (SCSI), Firewire, peripheral component interconnection (PCI), PCI express (PCIe), nonvolatile memory express (NVMe), universal flash storage (UFS), secure digital (SD), multimedia card (MMC), embedded MMC (eMMC), or the like.

The buffer control circuit 126 is configured to control the RAM 130 under the control of the processor 122. The buffer control circuit 126 writes data in the RAM 130 and reads data from the RAM 130.

The memory interface 127 is configured to communicate with the nonvolatile memory 110 (refer to FIG. 1) under the control of the processor 122. The memory interface 127 transmits the first command CMD1 and the first address ADDR1 to the nonvolatile memory 110 and exchanges the first data DATA1 and a control signal CTRL with the nonvolatile memory 110.

In some embodiments, the RAM 130 as shown in FIG. 1 may not be provided in the storage device 100. That is, the storage device 100 may not have a separate memory outside the memory controller 120 and the nonvolatile memory 110. In this case, the buffer control circuit 126 may not be provided in the memory controller 120. A function of the RAM 130 may be performed by an internal RAM 123 of the memory controller 120.

The processor 122 may control the memory controller 120 using codes. The processor 122 may load codes from a nonvolatile memory (e.g., a read only memory) provided inside of the memory controller 120. The processor 122 may load codes received from the memory interface 127.

The bus 121 of the memory controller 120 may be divided into a control bus and a data bus. The data bus may be configured to transmit data in the memory controller 120 and the control bus may be configured to transmit control information such as a command and an address in the memory controller 120. The data bus and the control bus may be separated from each other and not interfere with or affect each other. The data bus may be connected to the host interface 125, the buffer control circuit 126, the error correction block 124 and the memory interface 127. The control bus may be connected to the host interface 125, the processor 122, the buffer control circuit 126, the RAM 123, and the memory interface 127.

Figure 20:
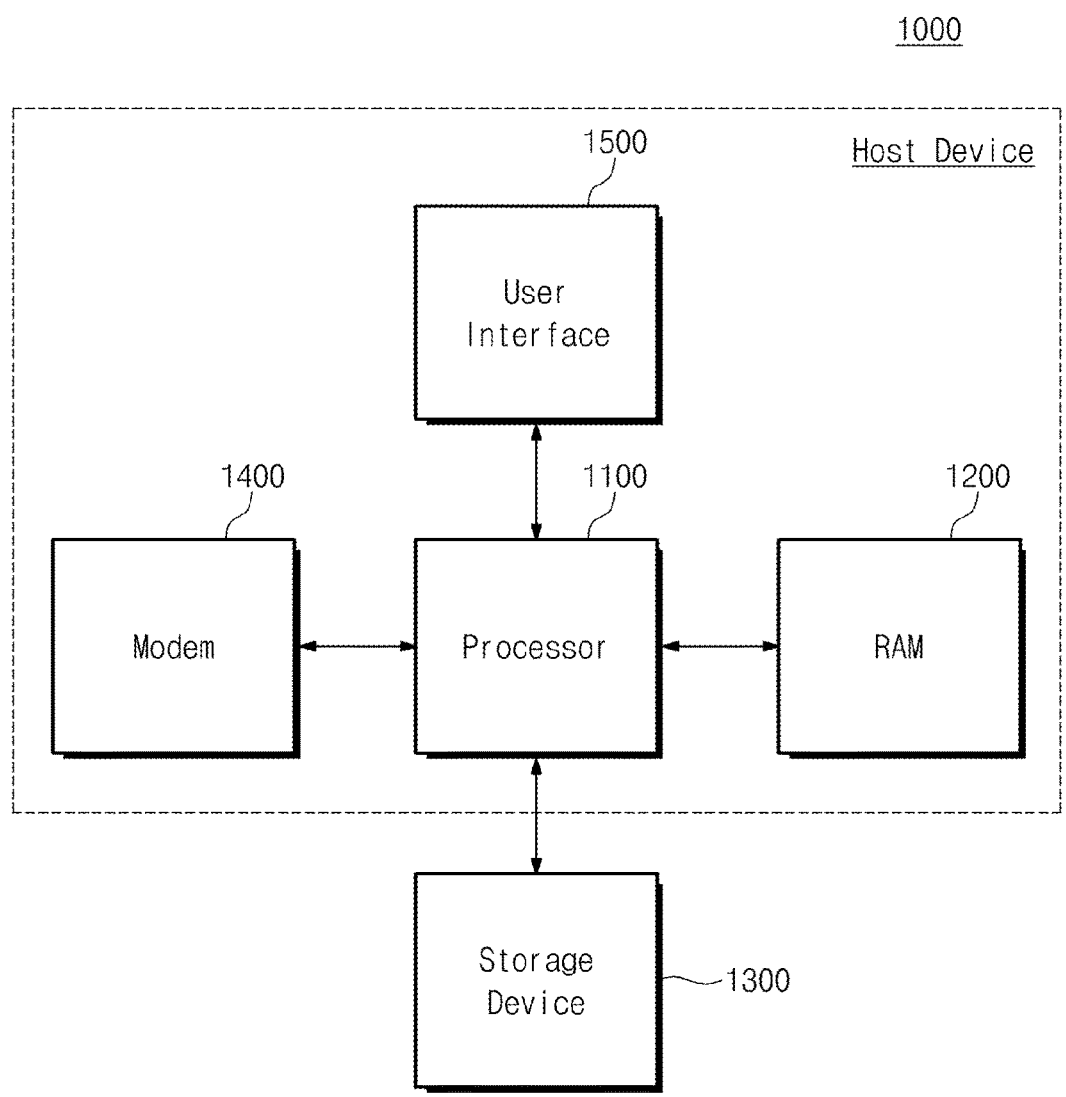
FIG. 20 is a block diagram illustrating a computing device in accordance with an embodiment of the inventive concept.

FIG. 20 is a block diagram illustrating a computing device 1000 in accordance with some embodiments of the inventive concept. Referring to FIG. 20, the computing device 1000 includes a processor 1100, a memory (RAM) 1200, a storage device 1300, a modem 1400, and a user interface 1500.

The processor 1100 controls an overall operation of the computing device 1000 and performs a logical operation. For example, the processor 1100 may be constituted by a system-on-chip. The processor 1100 may be a general-purpose processor, a special-purpose processor or an application processor.

The RAM 1200 communicates with the processor 1100. The RAM 1200 may be a main memory of the processor 1100 or the computing device 1000. The processor 1000 may temporarily store a code or data in the RAM 1200. The processor 1100 may execute a code and process data using the RAM 1200. The processor 1100 may execute various software such as an operating system and an application using the RAM 1200. The processor 1100 may control an overall operation of the computing device 1000 using the RAM 1200. The RAM 1200 may include a volatile memory such as a static RAM (SRAM), a dynamic RAM (DRAM), a synchronous DRAM (SDRAM), or the like, and a non-volatile memory such as a phase-change RAM (PRAM), a magnetic RAM (MRAM), a resistive RAM (RRAM), a ferroelectric RAM (FRAM), or the like.

The storage device 1300 communicates with the processor 1100. The storage device 1300 may store data that needs to be preserved for a long period of time. That is, the processor 1100 may store the data that needs to be preserved for a long period of time in the storage device 1300. The storage device 1300 may store a boot image for driving the computing device 1000. The storage device 1300 may store source codes of various software such as an operating system and an application. The storage device 1300 may store data processed by various software such as an operating system and an application.

The processor 1100 drives various software such as an operating system and an application by loading source codes stored in the storage device 1300 in the RAM 1200 and executing the source codes loaded in the RAM 1200. The processor 1100 may load data stored in the storage device 1300 in the RAM 1200 and may process the data loaded in the RAM 1200. The processor 1100 may store data that needs to be preserved for a long period of time among data stored in the RAM 1200 in the storage device 1300.

The storage device 1300 may include a nonvolatile memory such as a flash, a phase-change RAM (PRAM), a magnetic RAM (MRAM), an resistive RAM (RRAM), a ferroelectric RAM (FRAM), or the like.

The modem 1400 performs a communication with an external device under the control of the processor 1100. For example, the modem 1400 may perform a wired or wireless communication with the external device. The modem 140 may perform a communication based on at least one of various wireless communication methods such as long term evolution (LTE), WiMax, global system for mobile communication (GSM), code division multiple access (CDMA), Bluetooth, near field communication (NFC), WiFi, radio frequency Identification (RFID), or at least one of various wired communication methods such as universal serial bus (USB), serial AT attachment (SATA), small computer small interface (SCSI), Firewire, peripheral component interconnection (PCI), PCI express (PCIe), nonvolatile memory express (NVMe), universal flash storage (UFS), secure digital (SD), secure digital input output (SDIO), universal asynchronous receiver transmitter (UART), SPI (serial peripheral interface), high speed SPI (HS-SPI), RS232, inter-integrated circuit (I2C), HS-I2C, integrated-interchip sound (I2S), Sony/Philips digital interface (S/PDIF), multimedia card (MMC), embedded MMC (eMMC), or the like.

The user interface 1500 communicates with a user under the control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, or the like. The user interface 1500 may include user output interfaces such as a liquid crystal display (LCD), an organic light emitting diode (OLED) display, an active matrix OLED (AMOLED) display, an LED, a speaker, a motor, or the like.

The storage device 1300 may include the storage device 100 in accordance with some embodiments of the inventive concept. The processor 1100, the RAM 1200, the modem 1400 and the user interface 1500 may form a host device communicating with the storage device 1300.

The storage device 1300 may be constituted by the nonvolatile memory 110 (refer to FIG. 1) and the error correction block 124 (refer to FIG. 19). Other constituent elements of the storage device 1300 may be provided to a host device.

According to some embodiments of the inventive concept, memory cells are prevented from being left in an erase state and are thus prevented from deteriorating. Thus, an operation method of a nonvolatile memory having improved reliability, and an operation method of a storage device including the nonvolatile memory, are provided.

Although a various embodiments of the inventive concept have been shown and described, it should be appreciated by those skilled in the art that changes may be made to these various embodiments without departing from the principles and spirit of the general inventive concept, the scope of which is defined in the appended claims and their equivalents.

What is claimed is:

1. An operation method of a storage device including a nonvolatile memory and a memory controller configured to control the nonvolatile memory, the operation method comprising:
    transmitting a single multi-program command to the nonvolatile memory from the memory controller;
    programming memory cells connected to two or more word lines of a memory block in the nonvolatile memory to close the memory block responsive to the single multi-program command;
    transmitting a program command to the nonvolatile memory from the memory controller; and
    programming memory cells connected to a word line in the nonvolatile memory to store data responsive to the program command.

2. The operation method of claim 1, further comprising:
    selecting a memory block of the nonvolatile memory to be closed; and
    determining whether memory cells connected to two or more word lines of the selected memory block are in an erase state,
    wherein said transmitting the single multi-program command comprises transmitting the single multi-program command corresponding to the selected memory block responsive to determination that the memory cells connected to the two or more word lines of the selected memory block are in the erase state.

3. The operation method of claim 1, further comprising:
    determining whether an external device connected to the storage device has entered a power-off process; and
    determining whether a memory block of the nonvolatile memory is an open memory block,
    wherein said transmitting the single multi-program command comprises transmitting the single multi-program command to program word lines connected to memory cells of the open memory block that are in an erase state, responsive to determination of entry into the power-off process.

4. The operation method of claim 1, further comprising:
    detecting restoration of the storage device from a sudden power off state; and
    determining whether a memory block of the nonvolatile memory is an open memory block,
    wherein said transmitting the single multi-program command comprises transmitting the single multi-program command to program word lines connected to memory cells of the open memory block that are in an erase state, responsive to detection of the restoration from the sudden power off state.

5. The operation method of claim 1, further comprising:
    receiving an erase request from an external host connected to the storage device;
    erasing a memory block of the nonvolatile memory responsive to the erase request; and
    determining whether a write request to the erased memory block is scheduled,
    wherein said transmitting the single multi-program command comprises transmitting the single multi-program command to program the erased memory block, responsive to determination that the write request is not scheduled.

6. The operation method of claim 1, wherein the two or more word lines are programmed at a same time.

7. The operation method of claim 1, wherein memory cells of the nonvolatile memory are connected to bit lines and word lines including the two or more word lines, and
    wherein said programming the memory cells comprises:
    biasing the bit lines to a voltage based on dummy data;
    applying a pass voltage to the word lines; and
    applying a program voltage to the two or more word lines.

8. The operation method of claim 7, wherein said programming memory cells further comprises:
    biasing the bit lines to a power supply voltage;
    applying a verification voltage to the two or more word lines; and
    applying a read voltage to the word lines other than the two or more word lines.

9. The operation method of claim 1, wherein the memory cells connected to the two or more word lines are programmed to have a threshold voltage distribution range greater than a threshold voltage distribution range of an erase state.

10. The operation method of claim 1, wherein said programming the memory cells comprises:
    programming memory cells connected to a first word line among the two or more word lines to have a first threshold voltage distribution range greater than a threshold voltage distribution range of an erase state; and
    programming memory cells connected to a second word line among the two or more word lines to have a second threshold voltage distribution range higher than the first threshold voltage distribution range.

11. The operation method of claim 10, wherein among the first and second word lines, the second word line is located closer to remaining ones of the word lines other than the first and second word lines.

12. The operation method of claim 1, wherein said programming the memory cells comprises programming using dummy data without receiving data from the memory controller.

13. The operation method of claim 1, wherein said programming of the memory cells comprises programming the memory cells repeatedly a predetermined number of times without verification of the memory cells.

14. An operation method of a nonvolatile memory comprising:
receiving a single multi-program command at the nonvolatile memory;
programming memory cells connected to two or more word lines of a memory block in the nonvolatile memory using dummy data to close the memory block responsive to the single multi-program command;
receiving a program command at the nonvolatile memory; and
programming other memory cells connected to a word line in the nonvolatile memory to store data responsive to the program command.

15. The operation method of claim 14, wherein the memory cells are simultaneously programmed using the dummy data.

16. A storage device comprising:
a nonvolatile memory comprising a plurality of memory blocks; and
a memory controller configured to select a memory block to be closed from among the memory blocks of the nonvolatile memory, the selected memory block including memory cells that are connected to two or more word lines and that are in an erase state, the memory controller further configured to transmit a single multi-program command with information of the selected memory block,
wherein the nonvolatile memory is configured to program the memory cells of the selected memory block connected to the two or more word lines using dummy data to close the selected memory block, responsive to the single multi-program command;
wherein the memory controller selects another memory block and transmits a program command with information of the selected another memory block, and
wherein the nonvolatile memory programs other memory cells of the selected another memory block connected to a word line to store data responsive to the program command.

17. The storage device of claim 16, wherein the memory controller is further configured to determine whether an external device connected to the storage device has entered a power-off process, to determine whether a memory block from among the memory blocks is an open memory block, and to transmit the single multi-program command with information of the open memory block responsive to determination of entry into the power-off process,
wherein the nonvolatile memory is further configured to program memory cells that are connected to two or more word lines of the open memory block and that are in an erase state using the dummy data, responsive to the single multi-program command.

18. The storage device of claim 16, wherein the memory controller is further configured to detect restoration of the storage device from a sudden power off state, to determine whether a memory block from among the memory blocks is an open memory block, and to transmit the single multi-program command with information of the open memory block responsive to determination of the restoration from the sudden power off state,
wherein the nonvolatile memory is further configured to program memory cells that are connected to two or more word lines of the open memory block and that are in an erase state using the dummy data, responsive to the single multi-program command.

19. The storage device of claim 16, wherein the memory controller is further configured to receive an erase request from an external host connected to the storage device, to erase a memory block of the nonvolatile memory responsive to the erase request, to determine whether a write request to the erased memory block is scheduled, and to transmit the single multi-program command with information of the erased memory block responsive to determination that the write request is not scheduled.

20. The storage device of claim 16, wherein the volatile memory is further configured to program the memory cells of the selected memory block connected to the two or more word lines simultaneously.

* * * * *